United States Patent
Shur et al.

(10) Patent No.: US 10,923,619 B2
(45) Date of Patent: Feb. 16, 2021

(54) SEMICONDUCTOR HETEROSTRUCTURE WITH AT LEAST ONE STRESS CONTROL LAYER

(71) Applicant: Sensor Electronic Technology, Inc., Columbia, SC (US)

(72) Inventors: Michael Shur, Latham, NY (US); Alexander Dobrinsky, Loudonville, NY (US); Maxim S. Shatalov, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 676 days.

(21) Appl. No.: 15/602,651

(22) Filed: May 23, 2017

(65) Prior Publication Data
US 2017/0352776 A1 Dec. 7, 2017

Related U.S. Application Data

(60) Provisional application No. 62/344,179, filed on Jun. 1, 2016.

(51) Int. Cl.
*H01L 33/00* (2010.01)
*H01L 33/02* (2010.01)
(Continued)

(52) U.S. Cl.
CPC ........ *H01L 33/0025* (2013.01); *H01L 33/007* (2013.01); *H01L 33/0075* (2013.01);
(Continued)

(58) Field of Classification Search
CPC ........... H01L 33/0025; H01L 33/02075; H01L 33/025; H01L 33/06; H01L 33/12;
(Continued)

(56) References Cited

U.S. PATENT DOCUMENTS 9,105,792 B2 8/2015 Jain et al.
9,196,791 B2 11/2015 Choi et al.
(Continued)

FOREIGN PATENT DOCUMENTS

| JP | 2013197571 A | 9/2013 |
|----|--------------|--------|
| KR | 20110042944 A | 4/2011 |
| KR | 20140131770 A | 11/2014 |

OTHER PUBLICATIONS

International Application No. PCT/KR2017/005521, International Search Report and Written Opinion, dated Aug. 18, 2017, 8 pages.
(Continued)

*Primary Examiner* — Marvin Payen
*Assistant Examiner* — Vernon P Webb
(74) *Attorney, Agent, or Firm* — LaBatt, LLC

(57) ABSTRACT

A semiconductor heterostructure for an optoelectronic device is disclosed. The semiconductor heterostructure includes at least one stress control layer within a plurality of semiconductor layers used in the optoelectronic device. Each stress control layer includes stress control regions separated from adjacent stress control regions by a predetermined spacing. The stress control layer induces one of a tensile stress and a compressive stress in an adjacent semiconductor layer.

20 Claims, 14 Drawing Sheets

(51) Int. Cl.
*H01L 33/06* (2010.01)
*H01L 33/12* (2010.01)
*H01L 33/16* (2010.01)
*H01L 33/20* (2010.01)
*H01L 33/22* (2010.01)
*H01L 33/32* (2010.01)
*H01L 33/38* (2010.01)

(52) U.S. Cl.
CPC ............ *H01L 33/025* (2013.01); *H01L 33/06* (2013.01); *H01L 33/12* (2013.01); *H01L 33/16* (2013.01); *H01L 33/20* (2013.01); *H01L 33/22* (2013.01); *H01L 33/32* (2013.01); *H01L 33/385* (2013.01)

(58) Field of Classification Search
CPC ......... H01L 33/16; H01L 33/20; H01L 33/22; H01L 33/32; H01L 33/385
USPC ...................................................... 257/13–20
See application file for complete search history.

(56) References Cited

U.S. PATENT DOCUMENTS

| | | | |
|---|---|---|---|
| 9,397,260 B2 | 7/2016 | Jain et al. | |
| 9,412,902 B2 | 8/2016 | Shatalov et al. | |
| 9,537,054 B2 | 1/2017 | Billingsley et al. | |
| 9,646,911 B2 | 5/2017 | Shur et al. | |
| 9,691,939 B2 | 6/2017 | Jain et al. | |
| 9,799,793 B2 | 10/2017 | Billingsley et al. | |
| 9,806,228 B2 | 10/2017 | Jain et al. | |
| 2012/0201264 A1 | 8/2012 | Shatalov et al. | |
| 2013/0193480 A1 | 8/2013 | Sun et al. | |
| 2014/0110754 A1 | 4/2014 | Jain et al. | |
| 2014/0191261 A1 | 7/2014 | Shatalov et al. | |
| 2014/0302665 A1 | 10/2014 | Stauss et al. | |
| 2016/0118536 A1* | 4/2016 | Shatalov | H01L 33/10 257/13 |
| 2017/0104132 A1 | 4/2017 | Jain et al. | |
| 2017/0110628 A1 | 4/2017 | Shatalov et al. | |

OTHER PUBLICATIONS

Jain et. al., "Migration enhanced lateral epitaxial overgrowth of AlN and AlGaN for high reliability deep ultraviolet light emitting diodes," 2008, 4 pages, Applied Physics Letters.

Sakai et al., "Growth of high-quality GaN films on epitaxial AlN/sapphire templates by MOVPE," 2002, 6 pages, Journal of Crystal Growth.

Wu et al., "Efficiency Improvement Using Thickness-Chirped Barriers in Blue InGaN Multiple Quantum Wells Light Emitting Diodes," 2013, 10 pages, IEEE Photonics Journal.

\* cited by examiner

GaN thermal expansion

Temperature-dependent variation of the in-plane thermal expansion coefficient ($a_a$) of GaN AlN thermal expansion

SEMICONDUCTOR HETEROSTRUCTURE WITH AT LEAST ONE STRESS CONTROL LAYER

REFERENCE TO RELATED APPLICATIONS

The present patent application claims the benefit of U.S. Provisional Application No. 62/344,179, filed on 1 Jun. 2016, which is hereby incorporated by reference in its entirety to provide continuity of disclosure.

TECHNICAL FIELD

The disclosure relates generally to semiconductor heterostructures for optoelectronic devices, and more particularly, to a semiconductor heterostructure with at least one stress control layer for improving performance and reliability of an optoelectronic-based semiconductor device.

BACKGROUND ART

Optoelectronic-based semiconductor devices such as semiconductor emitting devices include light emitting diodes (LEDs) composed of group III-V semiconductors. Ultraviolet (UV) LEDs based on group III nitride semiconductor layers are a subset of LEDs composed of group III-V semiconductors. The performance and reliability of UV LED devices based on group III nitride semiconductor layers are dependent on many factors. The efficiency of these devices is one factor that has a role on performance and reliability. Typically, the efficiency of UV LEDs based on group III nitride semiconductor layers can be increased by minimizing dislocation density and a number of cracks in the semiconductor layers. Approaches to minimizing the dislocation density and the number of cracks in these UV LED devices have sought to grow low-defect semiconductor layers on patterned substrates. These substrate patterning approaches typically rely on reducing stresses present in epitaxially grown semiconductor layers. While substrate patterning is a common route to achieving higher quality epitaxial layers, this approach is expensive for production of UV LEDs in large quantities, and does not necessary translate into improvements in performance and reliability.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to minimizing the dislocation density and/or the number of cracks in the semiconductor layers of a semiconductor heterostructure used in an optoelectronic device by patterning one or more these layers in order to form stress control layers in various locations of the heterostructure. The stress control layers can be formed by epitaxially growing the layers on the patterned surfaces in the semiconductor heterostructure. Optimizing the epitaxial growth of the stress control layers on the patterned surfaces facilitates growth of group III nitride semiconductor layers over a lattice mismatched substrate.

Forming a stress control layer on a patterned surface enables the layer to induce tensile or compressive stresses to each adjacent layer in the semiconductor heterostructure. In one embodiment, the induced stress can change a stress in an adjacent layer by at least 10% as compared to a semiconductor heterostructure having no stress control layer. This change in stress of the adjacent layer can extend from a boundary with the stress control layer into an interior portion of the adjacent layer that is at least two thickness lengths of the stress control layer. In addition, formation of a stress control layer on a patterned surface can result in a plurality of stress control regions, domains or islands, with each stress control region separated from adjacent stress control regions by a predetermined spacing. In one embodiment, each stress control region can have a characteristic size that is approximately equivalent to one of: a square root of an inverse dislocation density in the adjacent layer or a distance of a critical strain within the adjacent layer. In one embodiment, the predetermined spacing that separates each of the stress control regions can correspond with a characteristic distance between dislocation cores formed in an adjacent semiconductor layer, such that each stress control region coincides with one of the dislocation cores in the adjacent semiconductor layer. In another embodiment, each of the stress control regions can have a characteristic width that corresponds to a current spreading length of an adjacent semiconductor layer.

The stress control regions can be formed to have a variety of configurations. In one embodiment, the stress control regions in a stress control layer can vary in height, thickness, shape, size, and/or the like, in a lateral direction and/or a vertical (growth) direction. For example, sets of stress control regions in each of the lateral direction and the vertical direction of a stress control layer can form a multitude of grouped domains, such that each grouped domain is disunited from other grouped domains in the stress control layer. In this manner, the grouped domains can form a network of connected domains or a patterned periodic structure in the stress control layer. In one embodiment, the set of stress control regions in each grouped domain can differ from the set of stress control regions in other disunited domains in thickness, shape, and/or size.

In another embodiment, the stress control regions can have varying materials across a stress control layer. In one embodiment, the stress control regions can extend into adjacent semiconductor layers. For example, some of the stress control regions can extend into adjacent semiconductor layers to form a void region in the adjacent semiconductor layers. In another example, some of the stress control regions that extend into adjacent semiconductor layers can include a surface roughness extending from a portion of the stress control region in the stress control layer to a portion of the stress control region extending into the adjacent semiconductor layers.

In one embodiment, the semiconductor heterostructure can have more than one stress control layer located in different locations of the heterostructure. These stress control layers can be formed from a variety of materials. For example, the stress control layer can include dielectric materials and semiconductor materials. In one embodiment, the semiconductor heterostructure can have at least two stress control layers, wherein each stress control layer is formed in a different semiconductor layer of the heterostructure and includes a different compositional material. In another embodiment, a first stress control layer can be formed in a buffer layer placed on the substrate, and a second stress control layer can have a p-type stress control portion and an n-type stress control portion. To this extent, the p-type stress control portion can be formed over a p-type metallic contact and a p-type contact semiconductor layer. In addition, the p-type stress control portion can include a plurality of p-type stress control protrusions that penetrate through the p-type metallic contact into the p-type contact semiconductor layer. The n-type stress control portion can be formed over an n-type metallic contact and an n-type contact semiconductor layer. Also, the n-type stress control portion can include a plurality of n-type stress control protrusions that penetrate through the n-type metallic contact into the n-type contact semiconductor layer.

In one embodiment, the stress control layer can include stacks of stress control regions extending in a lateral direction. The stacks of stress control regions can be arranged in a variety of patterns. For example, each stack of stress control regions can be shifted horizontally in relation to the stacks of stress control regions in immediately adjacent levels of the stress control layer or in layers adjacent to the stress control layer. In another embodiment, the stacks of stress control regions can be spaced apart from each other to form a plurality of spaced elevated regions. In this manner, one of the semiconductor layers can be epitaxially grown over and in between all of the elevated regions.

In one embodiment, the stress control layer can include a laminate structure of laminate layers. Each laminate layer can include a plurality of segmented stress control regions. The segmented stress control regions in each laminate layer can be formed of materials that are different than the segmented stress control regions in the other laminate layers in the laminate structure. In one embodiment, the laminate layers in the laminate structure can have different coefficients of thermal expansion. The laminate layers can also have different indexes of refraction for a predetermined wavelength of radiation. In one embodiment, the laminate layers can have alternating indexes of refraction.

The layers that are patterned to form the stress control layers can be patterned with a variety of patterns. For example, the patterned layers can have a plurality of elevated regions with flat depressions formed between each of the elevated regions. In this manner, one or more semiconductor layers can be epitaxially grown over the elevated regions and in between the flat depressions. In one embodiment, the patterned stress control layer can include a patterned polycrystalline material or a patterned amorphous group III nitride semiconductor material. In another embodiment, the elevated regions in the stress control layers can form nano-pillars. Some of the nano-pillars can extend beyond the semiconductor layer epitaxially grown over the elevated regions and in between the flat depressions into adjacent semiconductor layers. In one embodiment, some of the nano-pillars can extend upward to adjacent semiconductor layers epitaxially grown over the stress control layer, and some of the nano-pillars can extend downward to adjacent semiconductor layers epitaxially grown under the stress control layer. In another embodiment, some of the nano-pillars can have an outer surface with a surface roughness formed thereon.

In one embodiment, more than one patterned stress control layer can be used to form a stress control layer. In this manner, a superlattice can be formed from a plurality of patterned stress control layers. In one embodiment, the patterned stress control layers in the superlattice can have varying coefficients of thermal expansion and/or indexes of refraction.

A first aspect of the invention provides a semiconductor heterostructure, comprising: a substrate; a plurality of semiconductor layers located on the substrate; and at least one stress control layer located within the plurality of semiconductor layers, each of the at least one stress control layer inducing one of: a tensile stress or a compressive stress, in an adjacent semiconductor layer in the plurality of semiconductor layers, the induced stress changing a stress in the adjacent semiconductor layer by at least 10% as compared to a semiconductor heterostructure having no stress control layer, the change in stress of the adjacent semiconductor layer extending from a boundary with the stress control layer into an interior portion of the adjacent semiconductor layer that is at least twice a thickness of the stress control layer, wherein each at least one stress control layer includes a plurality of stress control regions, each stress control region separated from adjacent stress control regions by a predetermined spacing, each stress control region having a characteristic size that is approximately equivalent to one of: a square root of an inverse dislocation density in the adjacent semiconductor layer or a distance resulting in a critical strain within the adjacent semiconductor layer.

A second aspect of the invention provides a optoelectronic device, comprising: a substrate; a semiconductor heterostructure formed on the substrate, the semiconductor heterostructure including set of semiconductor layers epitaxially grown over the substrate, and a semiconductor heterostructure located on the substrate, the semiconductor heterostructure including plurality of semiconductor layers located on the substrate, the plurality of semiconductor layers including a stress control layer and an adjacent semiconductor layer, the stress control layer including a patterned layer having a plurality of elevated regions with flat depressions formed between each of the elevated regions, wherein the adjacent semiconductor layer is located over the elevated regions and in between the flat depressions, the stress control layer inducing one of: a tensile stress or a compressive stress, in the adjacent semiconductor layer, the induced stress changing a stress in the adjacent semiconductor layer by at least 10% as compared to a semiconductor heterostructure having no stress control layer, the change in stress of the adjacent semiconductor layer extending from a boundary with the stress control layer into an interior portion of the adjacent semiconductor layer that is at least twice a thickness of the stress control layer, and wherein each elevated region has a characteristic size that is approximately equivalent to one of: a square root of an inverse dislocation density in the adjacent semiconductor layer or a distance resulting in a critical strain within the adjacent semiconductor layer.

A third aspect of the invention provides a method, comprising: forming a semiconductor heterostructure, the forming including: obtaining a substrate; forming a semiconductor heterostructure on the substrate, the semiconductor heterostructure including plurality of semiconductor layers located on the substrate, the plurality of semiconductor layers including a stress control layer and an adjacent semiconductor layer, the stress control layer including a patterned layer having a plurality of elevated regions with flat depressions formed between each of the elevated regions, wherein the adjacent semiconductor layer is located over the elevated regions and in between the flat depressions, the stress control layer inducing one of: a tensile stress or a compressive stress, in the adjacent semiconductor layer, the induced stress changing a stress in the adjacent semiconductor layer by at least 10% as compared to a semiconductor heterostructure having no stress control layer, the change in stress of the adjacent semiconductor layer extending from a boundary with the stress control layer into an interior portion of the adjacent semiconductor layer that is at least twice a thickness of the stress control layer, and wherein each elevated region has a characteristic size that is approximately equivalent to one of: a square root of an inverse dislocation density in the adjacent semiconductor layer or a distance resulting in a critical strain within the adjacent semiconductor layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
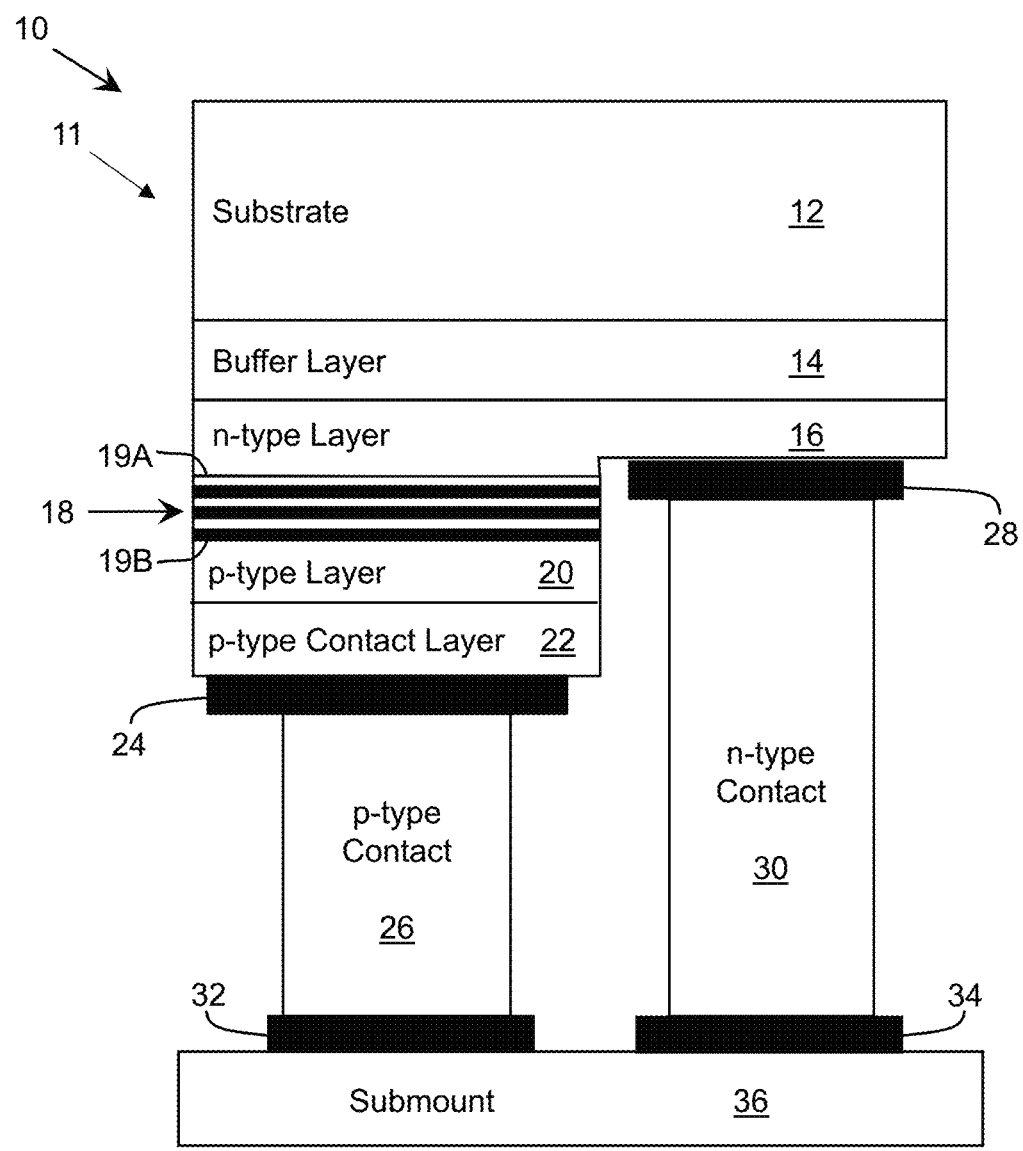
FIG. 1 shows a schematic of an illustrative optoelectronic device having a semiconductor heterostructure according to an embodiment.

As indicated above, aspects of the present invention are directed to minimizing the dislocation density and/or the number of cracks in the semiconductor layers of a semiconductor heterostructure used in an optoelectronic device by patterning one or more these layers to form stress control layers. The stress control layers can be formed by epitaxially growing the layers on the patterned surfaces in the semiconductor heterostructure. Optimizing the epitaxial growth of the stress control layers on the patterned surfaces facilitates growth of group III nitride semiconductor layers over a lattice mismatched substrate.

A layer of any of the group III nitride semiconductor heterostructures described herein can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by a light generating structure (e.g., peak emission wavelength +/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the group III nitride semiconductor heterostructures described herein can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The group III nitride semiconductor heterostructures described herein can be used to form one of a variety of optoelectronic or electronic devices. Examples of possible optoelectronic and electronic devices can include, but are not limited to, light emitting devices, light emitting diodes (LEDs), including conventional and super luminescent LEDs, light emitting solid state lasers, laser diodes, photodetectors, photodiodes, and high-electron mobility transistors (HEMTs). These examples of optoelectronic devices can be configured to emit or sense electromagnetic radiation in an active region upon application of a bias. The electromagnetic radiation emitted or sensed by these optoelectronic devices can comprise a peak wavelength within any range of wavelengths, including visible light, ultraviolet radiation, deep ultraviolet radiation, infrared light, and/or the like. For example, these optoelectronic devices can emit or sense radiation having a dominant wavelength within the ultraviolet range of wavelengths. As an illustration, the dominant wavelength can be within a range of wavelengths of approximately 210 nanometers (nm) to approximately 350 nm.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

Turning to the drawings, FIG. 1 shows a semiconductor heterostructure 11 that includes semiconductor layers and is part of an optoelectronic device 10. In a more particular embodiment, the optoelectronic device 10 is configured to operate as an emitting device, e.g., a light emitting diode (LED), such as a deep ultraviolet light emitting diode (DUV LED) or a conventional or super luminescent LED. Alternatively, the optoelectronic device 10 can be configured to operate as a light emitting solid state laser, a laser diode (LD), a photo-detector, a photodiode, or another type of optoelectronic or electronic (e.g., a HEMT) device. Additional aspects of the invention are shown and described in conjunction with the optoelectronic device 10. However, it is understood that embodiments can be utilized in conjunction with any type of optoelectronic device and/or any type of group III nitride-based device.

When the optoelectronic device 10 operates as an emitting device, application of a bias comparable to the band gap results in the emission of electromagnetic radiation from an active region 18 of the device 10. The electromagnetic radiation emitted by the optoelectronic device 10 can comprise a peak wavelength within any range of wavelengths, including visible light, ultraviolet radiation, deep ultraviolet radiation, infrared light, and/or the like. In an embodiment, the optoelectronic device 10 is configured to emit radiation having a dominant wavelength within the ultraviolet range of wavelengths. In a more specific embodiment, the dominant wavelength is within a range of wavelengths between approximately 210 and approximately 350 nanometers.

The semiconductor heterostructure 11 of the optoelectronic device 10 can include a substrate 12, a buffer layer 14 adjacent to the substrate 12, an n-type semiconductor layer 16 (e.g., a contact layer, an electron supply layer, and/or the like) adjacent to the buffer layer 14, and the active region 18 having an n-type side 19A adjacent to the n-type semiconductor layer 16. Furthermore, the heterostructure of the optoelectronic device 10 includes a p-type semiconductor layer 20 (e.g., an electron blocking layer) adjacent to a p-type side 19B of the active region 18 and a p-type contact semiconductor layer 22 (e.g., a hole supply layer) adjacent to the p-type semiconductor layer 20.

In a more particular illustrative embodiment, the optoelectronic device 10 can be a group III-V materials based device, in which some or all of the various layers of the semiconductor heterostructure 11 are formed of elements selected from the group III-V materials system. In a still more particular illustrative embodiment, the various layers of the semiconductor heterostructure 11 of the optoelectronic device 10 can be formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \le W, X, Y, Z \le 1$, and $W+X+Y+Z=1$. Illustrative group III nitride materials can include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 can include an active region 18 (e.g., a series of alternating quantum wells and barriers) composed of $In_y Al_x Ga_{1-x-y}N$, $Ga_z In_y Al_x B_{1-x-y-z}N$, an $Al_x Ga_{1-x}N$ semiconductor alloy, or the like. Similarly, both the n-type semiconductor layer 16 and the p-type semiconductor layer 20 can be composed of an $In_y Al_x Ga_{1-x-y}N$ alloy, a $Ga_z In_y Al_x B_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the optoelectronic device 10, a p-type metal 24 can be attached to the p-type contact semiconductor layer 22 and a p-type contact 26 can be attached to the p-type metal 24. Similarly, an n-type metal 28 can be attached to the n-type contact semiconductor layer 16 and an n-type contact 30 can be attached to the n-type metal 28. The p-type metal 24 and the n-type metal 28 can form p-type and n-type ohmic contacts, respectively, to the corresponding layers 22, 16, respectively. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact.

In an embodiment, the p-type metal 24 and/or the n-type metal 28 can comprise several conductive and reflective metal layers, while the n-type contact 30 and/or the p-type contact 26 can comprise highly conductive metal. In an embodiment, the p-type contact semiconductor layer 22 and/or the p-type contact 26 can be transparent (e.g., semi-transparent or transparent) to the electromagnetic radiation generated by the active region 18. For example, the p-type contact semiconductor layer 22 and/or the p-type contact 26 can comprise a short period superlattice lattice structure, such as a transparent magnesium (Mg)-doped AlGaN/AlGaN short period superlattice structure (SPSL). Furthermore, the p-type contact 26 and/or the n-type contact 30 can be reflective of the electromagnetic radiation generated by the active region 18. In another embodiment, the n-type contact semiconductor layer 16 and/or the n-type contact 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the contacts 26, 30. In this case, the substrate 12 is located on the top of the optoelectronic device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type semiconductor layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the semiconductor heterostructure 11 of the optoelectronic device 10 described herein is only illustrative. To this extent, the semiconductor heterostructure 11 can include an alternative layer configuration, one or more additional layers, and/or the like. As a result, while the various layers are shown immediately adjacent to one another (e.g., contacting one another), it is understood that one or more intermediate layers can be present in the semiconductor heterostructure 11. For example, an illustrative semiconductor heterostructure 11 can include an undoped layer between the active region 18 and one or both of the p-type contact semiconductor layer 22 and the n-type semiconductor layer 16 (e.g., an electron supply layer).

Furthermore, the semiconductor heterostructure 11 can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type contact semiconductor layer 22 and the active region 18. Similarly, the semiconductor heterostructure 11 can include a p-type layer 20 located between the p-type contact semiconductor layer 22 and the active region 18. The DBR structure and/or the p-type layer 20 can comprise any composition based on a desired wavelength of the light generated by the device/heterostructure. In one embodiment, the DBR structure comprises a Mg, Mn, Be, or Mg+Si-doped p-type composition. The p-type layer 20 can comprise p-type AlGaN, AlInGaN, and/or the like. It is understood that the semiconductor heterostructure 11 can include both the DBR structure and the p-type layer 20 (which can be located between the DBR structure and the p-type contact layer 22) or can include only one of the DBR structure or the p-type layer 20. In an embodiment, the p-type layer 20 can be included in the semiconductor heterostructure 11 in place of an electron blocking layer. In another embodiment, the p-type layer 20 can be included between the p-type contact semiconductor layer 22 and an electron blocking layer.

The group III nitride semiconductor layers that can form the semiconductor heterostructure 11 are subject to stresses due to a number reasons that can include hetero-epitaxy, mismatch between thermal expansion coefficients of the substrate and the layers, variation in semiconductor composition and other factors. All of these factors can lead to reduced reliability and performance of the optoelectronic device 10. Incorporating one or more stress control layers in the layers of the semiconductor heterostructure 11 as described herein can alleviate or partially alleviate the stresses that build in the heterostructure.

Figure 2:
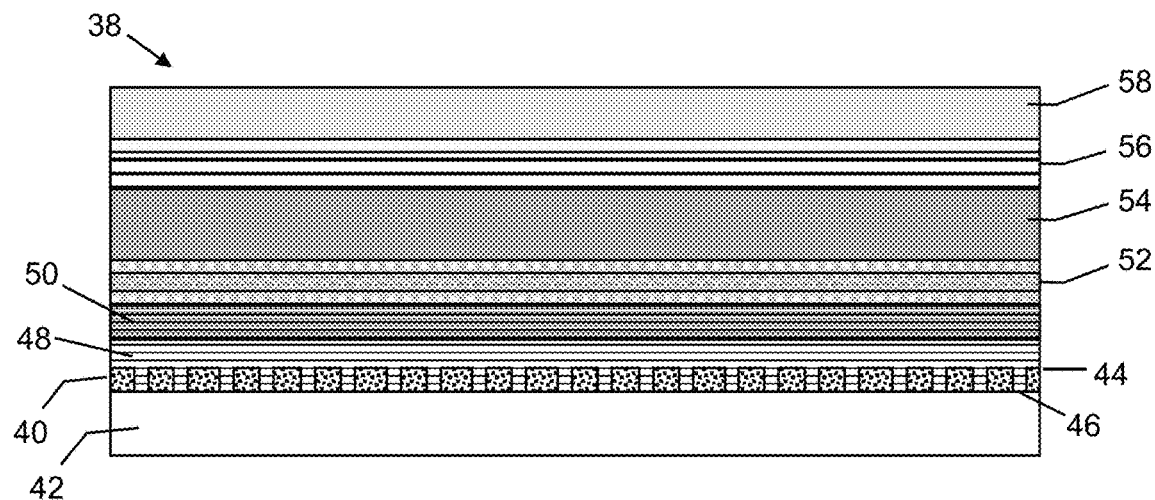
FIG. 2 shows a schematic of a semiconductor heterostructure with a patterned stress control layer.

FIG. 2 shows a schematic of a semiconductor heterostructure 38 with a patterned stress control layer 40 according to an embodiment. In particular, the semiconductor heterostructure 38 includes a substrate 42 that can include, but is not limited to, some of the aforementioned substrate materials such as sapphire, silicon carbide (SiC), silicon (Si), GaN, AlGaN, AlON, LiGaO$_2$. As shown in FIG. 2, the stress control layer 40 can be formed directly on the substrate 42. In one embodiment, the stress control layer 40 can include a patterned layer having a plurality of elevated regions 44 with flat depressions 46 formed between each of the elevated regions. The elevated regions 44 in the stress control layer 40 can form stress control regions or domains, with each stress control region separated from adjacent stress control regions by a predetermined spacing. The patterned stress control layer 40 allows epitaxial lateral overgrowth of a semiconductor layer on the flat depressions 46 and through the openings within the layer, and consecutive overgrowth of any additional layers included in the semiconductor heterostructure 38.

A buffer layer 48 can be grown over the stress control layer 40 and the substrate 42. For example, the buffer layer 48 can be epitaxially grown over the elevated regions 44 and in between the flat depressions 46 of the stress control layer 40. The buffer layer 48 can be formed from a material that includes, but is not limited to, some of the aforementioned buffer layer materials such as AlN, an AlGaN/AlN superlattice, and/or the like. In one embodiment, elevated regions 44 of the stress control layer can extend to within 500 nm of the buffer layer 48.

The additional semiconductor layers of the semiconductor heterostructure 38 can be epitaxially grown over buffer layer 48, the stress control layer 40 and the substrate 42. For example, a semiconductor layer 50 can be grown over the buffer layer 48. In one embodiment, the semiconductor layer 50 can include a superlattice $Al_xGa_{1-x}N/Al_yGa_{1-y}N$ layer. It is understood that a superlattice $Al_xGa_{1-x}N/Al_yGa_{1-y}N$ layer is only an example, and that the semiconductor layer 50 can include, but is not limited to, semiconductor layers having graded composition, semiconductor layers having a tensile and compressive sublayers that can result from variation of the growth parameters such as V/III ratio or variation in growth temperature/pressure, and/or the like.

A semiconductor layer 52 can be formed over the semiconductor layer 50. In one embodiment, the semiconductor layer 52 can include a tensile/compressive laminate of layers. For example, the tensile/compressive laminate of layers can include layers grown by changing a V/III ratio. Other examples of tensile/compressive laminate of layers that can be used for semiconductor layer 52 include, but are not limited to, layers containing semiconductor interlayers, wherein an interlayer can comprise a semiconductor layer of thickness less than one nanometer having a composition that is different from the composition of the neighboring layers by at least 10%.

An n-type semiconductor layer 54 (e.g., an n-type contact layer) can be formed on the semiconductor layer 52. The n-type semiconductor layer 54 can be formed from material that includes, but is not limited to, $Al_xIn_yBn_zGa_{1-x-y-z}N$, with $0 \leq x$, y, $z \leq 1$ and $0 \leq 1-x-y-z \leq 1$, having an n-type doping, wherein dopants can comprise Si, as an example.

An active region 56 can be formed over the n-type semiconductor layer 54. As noted above, the active region 56 can include a series of alternating quantum wells and barriers. In one embodiment, the active region 56 can be composed of $Al_qGa_{1-q}N$ quantum wells and $Al_bGa_{1-b}N$ barriers. It is understood that while, q and b values can be constant, one or both values can vary with the thickness of the quantum well and/or barrier, resulting in a graded composition. It is understood that the active region 56 can be composed of other group III-V materials systems, such as any of the aforementioned group III nitride based material systems.

A p-type semiconductor layer 58 (e.g., a p-type contact layer, an electron blocking layer, and/or the like) can be formed on the semiconductor layer 52. The p-type semiconductor layer 58 can be formed from material that includes, but is not limited to, $Al_pGa_{1-p}N$, with p-type dopants being Mg.

Those skilled in the art will appreciate that the types of layers in the semiconductor heterostructure 38 can vary as can the location and amounts of layers that are used to form the heterostructure. It is understood that the layers that form the semiconductor heterostructure 38 depicted in FIG. 2 are only illustrative of one example of a heterostructure of semiconductor layers that can be arranged with a stress control layer that facilitates growth of the layers over a lattice mismatched substrate, while controlling the stresses that arise from forming semiconductor layers, such as group III nitride layers, over a mismatched substrate.

The stress control layer 40 including each of the stress control regions in the elevated regions 44 between the flat depressions 46 can be formed from a dielectric or a semiconductor layer that is transparent to the emitted or absorbed radiation of the device incorporating the semiconductor heterostructure 38. Examples of a dielectric material that are suitable for use in the stress control layer 40 include, but are not limited to, CaO, ZnO, AAO, $SiO_2$, AlN, AlGaN, GaN, or MgO, while examples of a semiconductor that are suitable for use in the stress control layer 40 include, but are not limited to, CaO, ZnO, AAO, $SiO_2$, AlN, AlGaN, GaN, or MgO. In one embodiment, the stress control layer 40 can include an UV transparent oxide layer. Examples of an UV transparent oxide layer include, but are not limited to, MgO, ZnO, AlZnO, $SiO_2$, AAO, sapphire, $CaF_2$, and $MgF_2$. In other embodiments, the stress control layer 40 can include a polycrystalline or amorphous structure. For example, the polycrystalline or amorphous structure can include group III nitride semiconductor material.

In one embodiment, the stress control layer 40 can include $Al_xGa_{1-x}N$ with a lattice constant that is different from upper and lower adjacent neighboring layers by at least 1/50 of an angstrom. In still other embodiments, some of which are described herein, the stress control layer 40 can include pores, composite layers and morphological inhomogeneities, such as for example, roughness surfaces.

The patterned stress control layer 40 can control the stresses that arise in the various aforementioned semiconductor layers of the semiconductor heterostructure 38 due to a mismatched substrate by inducing a tensile stress or a compressive stress in a semiconductor layer that is adjacent to the stress control layer. In particular, the stresses can be introduced due to lattice mismatch between the layers. In one embodiment, the induced stress from the stress control layer 40 can change a stress in the adjacent layer by at least 10% as compared to the semiconductor heterostructure 38 having no stress control layer 40. In an embodiment, the induced stress results in a strain that is at least 0.5%. In another embodiment, the induced stress results in a stress that is at least 0.1 GPA. This change in stress of the adjacent layer can extend from a boundary with the stress control layer 40 into an interior portion of the adjacent layer that is at least twice a thickness of the stress control layer 40. In one embodiment, the stress control layer 40 can have a thickness that ranges from 0.5 nm to 100 nm, and between 10-40 nanometers in a more particular embodiment. In the embodiment depicted in FIG. 2, the stress control layer 40 can induce a stress in the buffer layer 48 which can extend from a boundary of both layers into an interior portion of the buffer layer and the semiconductor layer 50.

In one embodiment, the stress control layer 40 can have a thermal expansion coefficient that is at least 10% different from the thermal coefficient of at least one of its neighboring layers in the semiconductor heterostructure 38. For example, the stress control layer 40 can have a thermal expansion coefficient on the order of $10^{-6}$ 1/K, while the buffer layer 38 can have a thermal expansion coefficient of $3-4\times10^{-6}$ 1/K. A stress control layer 40 having a thermal expansion coefficient that is at least 10% different from the thermal coefficient of at least one of its neighboring layers enables stresses to be created/removed when device is cooled after the epitaxial growth. This is advantageous in that the stresses within a device can be controlled after the cooling state.

The stress control regions in the elevated regions 44 of the stress control layer 40 can include a multitude of characteristics that facilitate the control of stresses in the semiconductor layers of the semiconductor heterostructure 38. For example, each of the stress control regions can be separated from adjacent stress control regions by a predetermined spacing. In one embodiment, the predetermined spacing between the stress control regions can range from about 10 nm to about 10 microns, or between 100 nm-2 microns in a more particular embodiment. A spacing of this amount enables control of stresses over a lateral area of the layer by dispersing the stresses within a lateral area. In an embodiment, the characteristic size of the region experiencing stresses is selected for the resulting stress force to be lower than the one resulting in formation of cracks, dislocations and defects. In particular, the acceptable stress forces can be a fraction of a GPA $m^2$ which can be obtained by adjusting the stress levels of the stress control region and its size. In one embodiment, as described in more detail, the predetermined spacing separating each of the stress control regions can correspond with a characteristic distance between dislocation cores formed in the adjacent semiconductor layer. In this manner, each stress control region can coincide with one of the dislocation cores in the adjacent semiconductor layer. As used herein, the characteristic distance between dislocation cores can be calculated by an inverse square root from a dislocation density N: 1/sqrt(N). For instance, for a dislocation density of about $10^8$ dislocations per $cm^2$, the characteristic distance between dislocations is about 1 micron.

In one embodiment, each stress control region can have a characteristic size that is at least approximately equivalent to a square root of an inverse dislocation density in an adjacent layer. As used herein, the characteristic size of a stress control region can be estimated by a square root of the stress control region area. Having a characteristic size that is approximately equivalent to a square root of an inverse dislocation density in an adjacent layer is beneficial because a stress control region will influence at least one dislocation within the layer. Furthermore, a variation of the stresses along the lateral direction of the layer can result in additional dislocation bending, dislocation redirection, and/or dislocation annihilation. In one embodiment, each stress control region can have a characteristic size that is approximately equivalent to a distance of a critical strain within the adjacent layer. This distance to the critical strain can be determined based on the material quality of the epitaxially grown layer that is adjacent to the stress control layer 40 via an x-ray characterization. In one embodiment, each of the stress control regions can have a characteristic width that corresponds to a current spreading length of the adjacent semiconductor layer. As used herein, the characteristic width of a stress control region can be estimated as a square root of the stress control region area. Having stress control regions with a width that corresponds to a current spreading length of the adjacent semiconductor layer is beneficial because such regions will present less obstruction to the current flow within the semiconductor layer.

Figure 3:
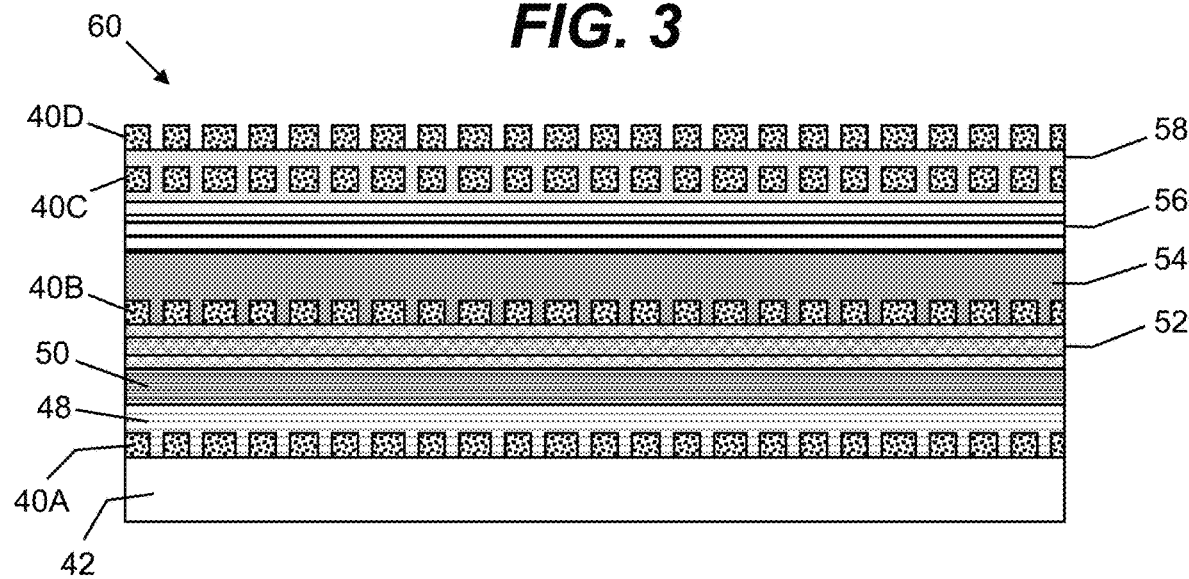
FIG. 3 shows a schematic of a semiconductor heterostructure with multiple stress control layers according to an embodiment.

FIG. 3 shows a schematic of a semiconductor heterostructure 60 with multiple stress control layers 40 (i.e., 40A, 40B, 40C and 40D) according to an embodiment. As shown in FIG. 3, the stress control layers can be formed at different locations within the semiconductor heterostructure 60. For example, a stress control layer 40A can be formed between the substrate 42 and the buffer layer 48. A stress control layer 40B can be formed between the semiconductor layer 52 and the n-type semiconductor layer 54. FIG. 3 also shows that a stress control layer 40C can be formed in the p-type semiconductor layer 58, while a stress control layer 40D can be formed on the p-type semiconductor layer. Having stress control layers in various layers of the semiconductor heterostructure 60 is advantageous because they can control both dislocation formation, dislocation annihilation and bending as well as the piezo-electrical stresses within each semiconductor layer adjacent to the stress control layer. For example, in FIG. 3, stress control layer 40A serves to reduce dislocation density through bending and annihilation, stress control layer 40B serves to reduce stresses in the n-type layer, stress control layer 40C serves to reduce stresses in the p-type layer, while stress control layer 40D serves to control stresses at an interface of the p-type layer and a metallic contact.

In one embodiment, all of the stress control layers 40A, 40B, 40C, and 40D can be UV transparent layers. Additionally, all of the stress control layers 40A, 40B, 40C, and 40D can compose different materials. For example, in one embodiment, the stress control layer 40A between the substrate 42 and the buffer layer 48 can include a UV transparent material such as AAO or $SiO_2$, while the stress control layer 40D above the p-type semiconductor layer 58 can include a UV absorbing material such as, for example, $Si_3N_4$. In addition to different materials, the stress control layers 40A, 40B, 40C, and 40D can include different patterning. For example, the stress control layer 40A can have a first patterning, while the stress control layer 40B can have a second patterning. It is also understood that the stress control layers 40A, 40B, 40C, and 40D can be patterned to have different shapes as described below in more detail with regard to other embodiments. For example, some stress control layers can be patterned to have protrusions that penetrate into one or more adjacent semiconductor layers.

Although heretofore, all of the stress control regions associated with each stress control layer have been described as being uniform in shape, composition, width and height, it is understood that these stress control region characteristics can vary, and that this variation can be interspersed among multiple layers in the heterostructure. For example, FIGS. 4A-4D show schematics of semiconductor heterostructures with stress control layers having stress control regions that can vary in thickness, material, height, depth, and/or surface roughness according to embodiments. The semiconductor heterostructures of FIGS. 4A-4D that contain layers that are in common with the semiconductor heterostructures of FIGS. 2-3 are labeled with like reference elements. The description for the common layers as described above with respect to FIGS. 2-3 is applicable to the semiconductor heterostructures of FIGS. 4A-4D. It is also understood that the embodiments depicted in FIGS. 4A-4D show stress control regions associated with each stress control layer that can vary in shape, composition, width and/or height. As such, these embodiments are not meant to be limited to these figures.

Figure 4A:
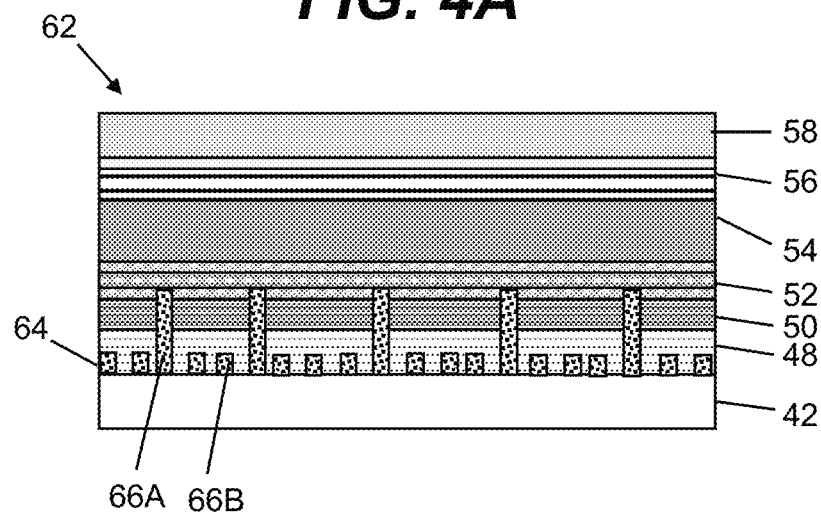
FIGS. 4A-4D show schematics of semiconductor heterostructures with stress control layers having stress control regions that can vary in thickness, material, height, depth and/or surface roughness according to embodiments.

FIG. 4A shows a semiconductor heterostructure 62 with a stress control layer 64 having stress control regions 66 (i.e., 66A and 66B) with varying heights. As shown in FIG. 4A, the stress control regions 66A are encapsulated by the buffer layer 48, while the stress control regions 66B penetrate through the buffer layer and the semiconductor layer 50 to contact a surface of the semiconductor layer 52. Stress control regions that are arranged in this manner provide stress control regions that simultaneously can control stresses in a stack of layers. For instance, the stress control regions 66B control stresses adjacent to buffer layer, while the stress control regions 66A control stresses in both regions adjacent to the buffer layer and semiconductor layers grown over the buffer layer. It is understood that the stress control regions 66A and 66B in this embodiment and others described herein can be formed using well-known techniques. For example, the stress control regions 66A and 66B can be fabricated by patterning and etching techniques.

Figure 4B:
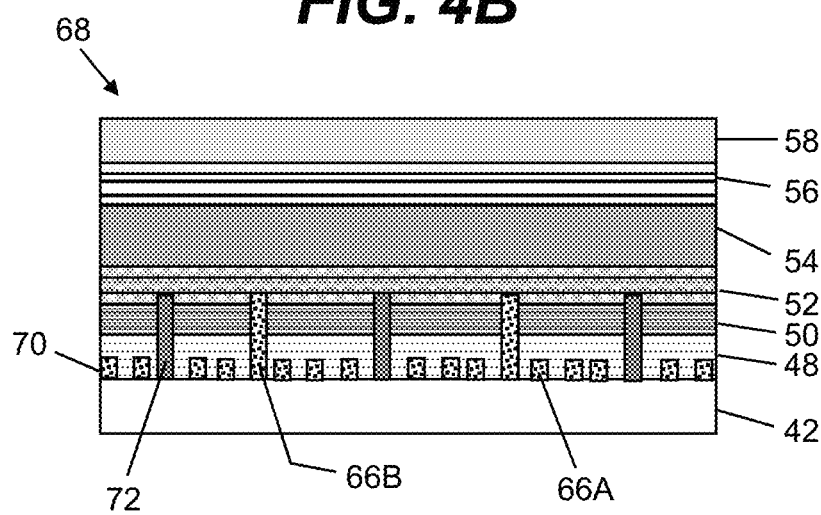

FIG. 4B shows a semiconductor heterostructure 68 with a stress control layer 70 having stress control regions 66A, 66B and 72. Like FIG. 4A, the stress control regions 66A, 66B and 72 have varying heights. As shown in FIG. 4B, the stress control regions 66A are encapsulated by the buffer layer 48, while the stress control regions 66B and 72 penetrate through the buffer layer and the semiconductor layer 50 to contact a surface of the semiconductor layer 52. In one embodiment, the stress control regions 66B and 72 can have different materials. For example, the stress control region 66B can include a dielectric such as $SiO_2$, $Al_2O_3$, and/or a similar dielectric, while stress control region 72 can include a vacancy (void), and/or different dielectric. In an embodiment, such material can comprise amorphous AlN and/or a crystalline semiconductor material of composition different from neighboring regions. In an embodiment, the semiconductor material can have a different characteristic lattice constant which can be achieved, for instance, through technique of epitaxial overgrowth.

Stress control regions that are arranged in this configuration can provide simultaneous control of stresses in a stack of layers, with each stress control region having its own mechanisms of stress control. For example, a region comprising a void will reduce stresses present in the neighboring layer, whereas a region comprising AlN can increase tensile stresses in the following semiconductor layers. It is understood that the stress control regions 66A, 66B and 72 can be configured in other arrangements where these domains have varying materials. For example, stress control regions 66B and 66A can be formed of the same material, while the stress control regions 72 can have a different material or stress control regions 66A and 72 can be formed of the same material, while the stress control regions 66B have a different material.

Figure 4C:
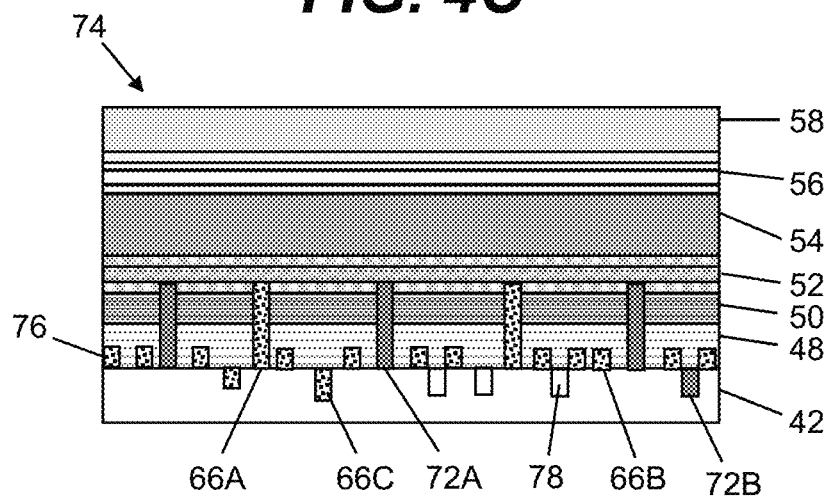

FIG. 4C shows a semiconductor heterostructure 74 with a stress control layer 76 having stress control regions 66A, 66B, 66C, 72A, 72B and 78. The stress control layer 76 of the semiconductor heterostructure 74 differs from the stress control layer 70 of the semiconductor heterostructure 68 in FIG. 4B in that these stress control regions extend into the adjacent layers in different directions. As shown in FIG. 4C, the stress control regions 66B are encapsulated by the buffer layer 48, the stress control regions 66A and 72A penetrate through the buffer layer and the semiconductor layer 50 to contact a surface of the semiconductor layer 52, while stress control regions 66C, 72B and 78 extend into the substrate 42. Stress control regions 66C and 72B can be formed from the same materials or they can vary and be composed of the same material of one of the stress control regions 66A and 72A as shown in FIG. 4C. In one embodiment, as depicted in FIG. 4C, the stress control regions 78 can form a void or vacancy region in the adjacent semiconductor layers (e.g., substrate). Stress control regions that are arranged in this configuration of FIG. 4C with varying heights, materials, direction of penetration into adjacent layers, and voids provide additional mechanisms for stress control. For instance, the voids can reduce stresses in the buffer region and can eliminate some of the dislocations in the buffer layer. It is understood that the stress control regions 66A, 66B, 66C, 72A, 7B and 78 can be configured in other arrangements and are not meant to be limited to the embodiment illustrated in FIG. 4C.

Figure 4D:
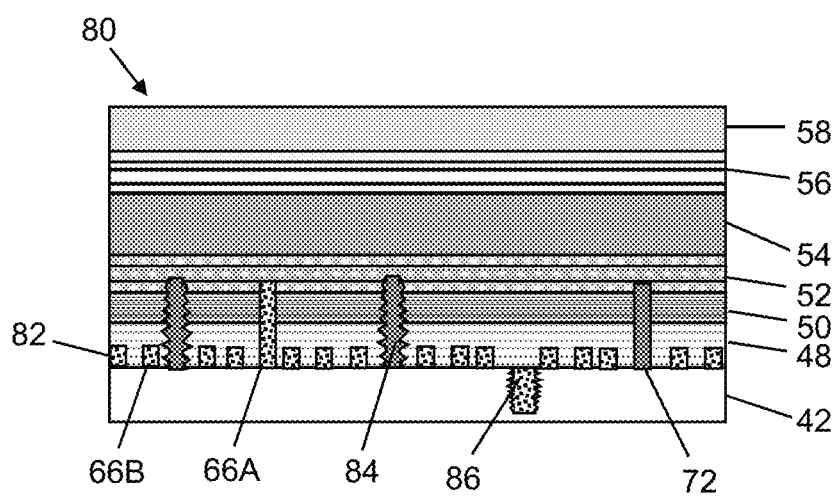

FIG. 4D shows a semiconductor heterostructure 80 with a stress control layer 82 having stress control regions 66A, 66B, 72, 84 and 86. In this embodiment, the stress control regions 84, 86 can have a surface roughness for improving light extraction from devices incorporating the semiconductor heterostructure 80. As used herein, surface roughness means that the surface of the interface between stress control regions and the neighboring layers have elements that can contribute to light scattering as light impinges at such interface. As shown in FIG. 4D, stress control region 84 penetrates through the buffer layer and the semiconductor layer 50 to contact a surface of the semiconductor layer 52, while stress control region 86 extends downward into the substrate 42. Stress control regions 84 and 86 can be formed from the same materials or they can vary and be composed of the same material of one of the stress control regions 66A, 66B or 72. It is understood that the stress control regions 66A, 66B, 72, 84 and 86 can be configured in other arrangements and are not meant to be limited to the embodiment illustrated in FIG. 4D.

Figure 5:
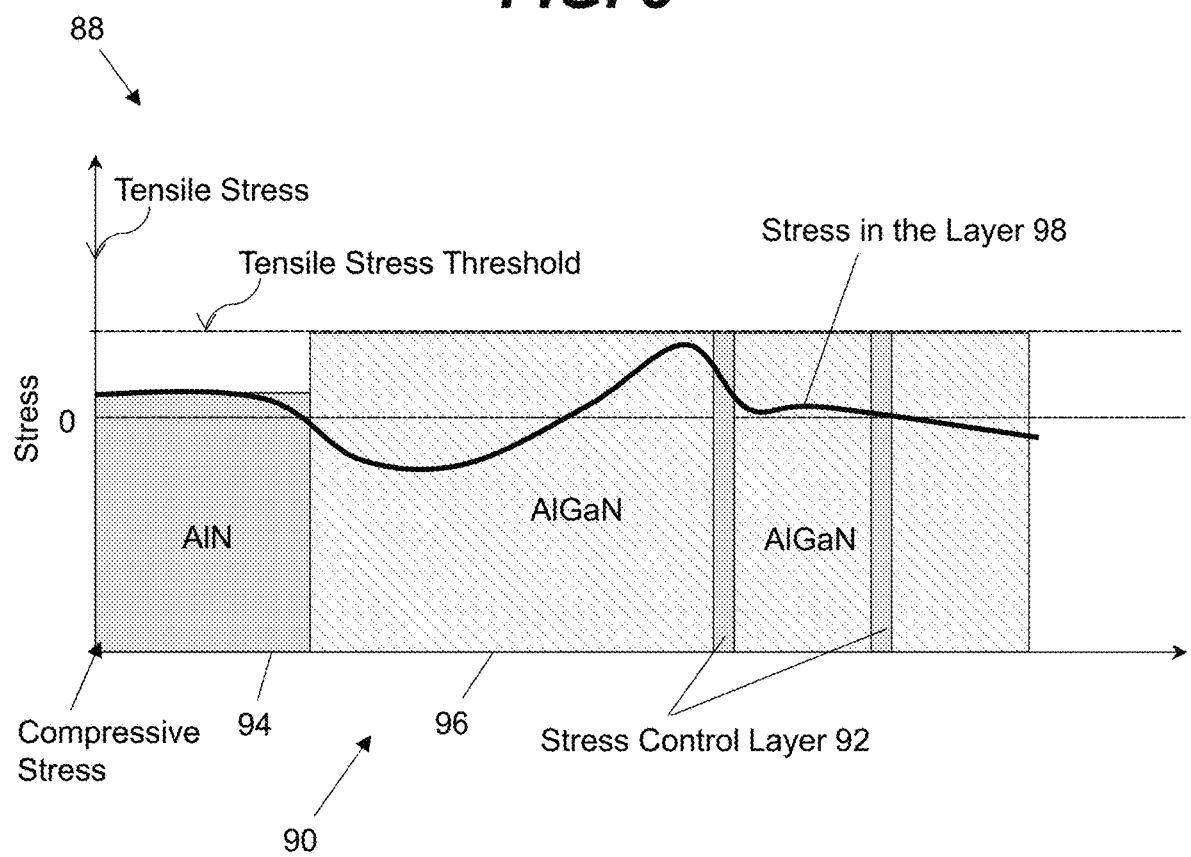
FIG. 5 is an example of a plot showing a profile of stresses in a semiconductor heterostructure with at least two stress control layers according to an embodiment.

FIG. 5 shows an example of a plot 88 illustrating a profile of stresses in a semiconductor heterostructure 90 with at least two stress control layers 92 according to an embodiment. In this example, the semiconductor heterostructure 90 includes a first semiconductor layer 94 including an AlN layer that functions as a buffer layer, a second semiconductor layer 96 including an AlGaN layer and two stress control layers 92 located within the AlGaN layer. The plot 88 of FIG. 5 illustrates how the location of the stress control layers 92 can be selected based on the stresses 98 within the epitaxially grown semiconductor layers 94 and 96. For example, as shown in FIG. 5, the first grown semiconductor layer 94 can exhibit tensile stresses due to nucleation conditions of the layer. The tensile stresses in the semiconductor heterostructure 90 change into compressive stresses due to changes in composition of semiconductor layers. In particular, the change into compressive stresses occurs in the region of the semiconductor heterostructure 90 where the AlGaN semiconductor layer is grown. The compressive stresses are associated with negative stresses and are depicted in FIG. 5 as those stresses below the "0" value.

As the AlGaN layer thickness is increased, the compressive stresses are relaxed and can lead to reduction of compressive stresses, or even to tensile stresses within AlGaN layer as shown in FIG. 5. Generally, a significant relaxation is undesirable, especially for those tensile stresses that approach or exceed a predetermined tensile stress threshold that can be established through experimentation. In this example, in order to avoid a significant relaxation, a stress control layer 92 is formed in this region of the AlGaN layer. FIG. 5 further shows that the other stress control layer 92 can be positioned in the AlGaN layer in a region separated from the first stress control layer to further reduce the tensile stresses within the AlGaN layer. It is understood that the example illustrated in FIG. 5 serves to explain where it may be desirable to place stress control layers in a semiconductor heterostructure, but it is not meant to be limiting.

Figure 6A:
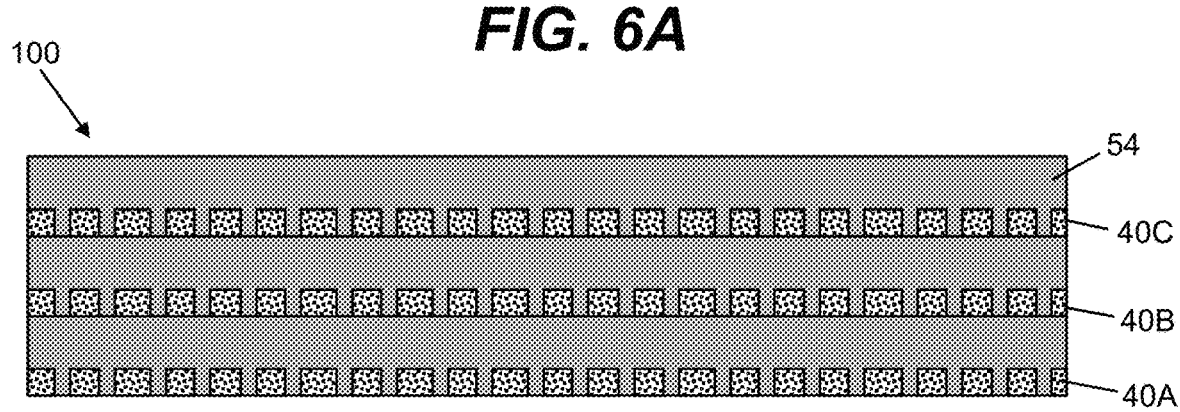
FIGS. 6A-6B show schematics of semiconductor heterostructures having different arrangements of multiple stress control layers according to embodiments.
Figure 6B:
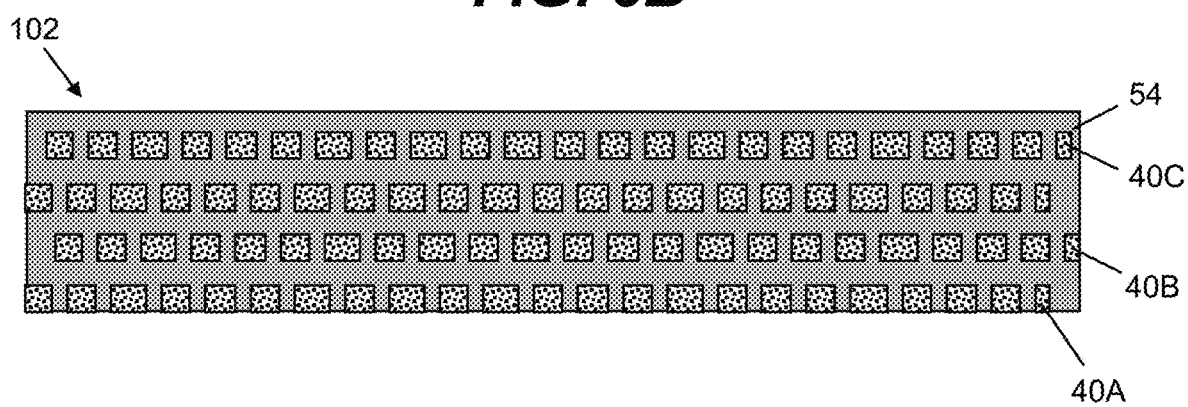

FIGS. 6A-6B show schematics of semiconductor heterostructures having different arrangements of multiple stress control layers according to embodiments. In the embodiments depicted in FIGS. 6A-6B the stress control layers are formed in one semiconductor layer of a heterostructure. For example, in the semiconductor heterostructures 100 and 102 of FIGS. 6A and 6B, respectively, stress control layers 40A, 40B, 40C are formed in multiple levels of the n-type semiconductor layer 54 creating stacks of stress control regions that extend in a lateral direction. In FIG. 6A, the stress control regions of the stress control layers 40A, 40B, 40C in each respective level of the n-type semiconductor layer 54 are in vertical alignment with each other. In FIG. 6B, the stress control regions of the stress control layers 40A, 40B, 40C in each respective level of the n-type semiconductor layer 54 are shifted horizontally relative to one another. That is, the stress control regions of the stress control layer 40A are laterally shifted relative to the stress control regions of the stress control layers 40B and 40C. In this manner, there is an overlap between the stress control regions of the stress control layers 40A, 40B, 40C. In this configuration, the overlap of the stress control regions of the stress control layers 40A, 40B, 40C enables further control of dislocation propagation throughout the semiconductor layer 54, as well as promotes light scattering from the stress control regions, whereas the vertically aligned stress control regions of FIG. 6A provides an embodiment which can be technologically easier to implement.

In one embodiment, the stacks of stress control regions can be formed from various materials. For example, the stacks of stress control regions can be formed of dielectric layers including, but not limited to, $SiO_2$, $CaF_2$, $MgF_2$, BN, ZnO, AlZnO and or the like. In one embodiment, the dielectric materials used for the layers are selected as a function of UV reflectivity. In this manner, the dielectric materials used for the stack of layers are selected to yield a stress control layer with high UV reflectivity. In one embodiment, the stacks of stress control regions can include alternating layers of $Al_2O_3$ and $HfO_2$.

In order to attain the advantages provided by FIGS. 6A-6B, the stress control layers 40A, 40B, 40C and their respective stress control regions can comprise very thin layers each having a thickness of few tens of nanometers or less, e.g., between 5-50 nanometers in a more particular embodiment. It is noted that such thin stress control layers may not significantly affect the electrical properties of the semiconductor heterostructure, while affecting the stress with a semiconductor layer. Also, although FIGS. 6A-6B depict the varying arrangement of stress control regions in multiple levels of a semiconductor layer in a semiconductor heterostructure, it is understood that such arrangements could be formed in different layers of the heterostructure.

In one embodiment, the stress control layers 40A, 40B, 40C can be placed in the semiconductor layer 54 to maintain a target stress within the layer. For example, the stress control layers 40A, 40B, 40C can be placed in the semiconductor layer 54 at a distance from each other that maintains the stress within the layer 54 to target stress. In one embodiment, the target stress can range from approximately 2.0 GPA to approximately 0.1 GPA.

Figure 7:
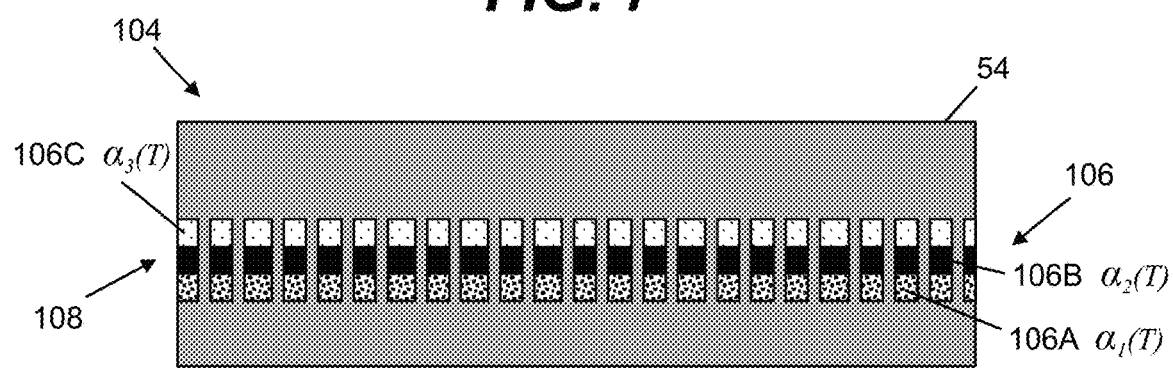
FIG. 7 shows a schematic of a semiconductor heterostructure having a stress control layer formed from a laminate structure of multiple materials according to an embodiment.

FIG. 7 shows a schematic of a semiconductor heterostructure 104 having a stress control layer 106 formed from a laminate structure 108 of multiple materials 106A, 106B and 106C according to an embodiment. As shown in FIG. 7, the laminate structure 108 is formed in an n-type semiconductor layer 54 of the semiconductor heterostructure 104. Although the laminate structure 108 is illustrated in FIG. 7 in the n-type semiconductor layer 54 of the semiconductor heterostructure 104, it is understood that the structure could be formed in different layers of the heterostructure, for example, in any of those layers depicted in the aforementioned heterostructures.

In one embodiment, laminate structure 108 can include a set of laminate layers formed from the materials 106A, 106B, and 106C that compose sublayers in the stress control layer 106. As shown in FIG. 7 each laminate layer 106A, 106B, and 106C of different materials includes a set of segmented stress control regions. Each segmented stress control region in a laminate layer is formed with the segmented stress control regions of the other layers in the laminate structure. For example, as shown in FIG. 7, each segmented portion of the laminate structure 108 includes different laminate layers of the 106A, 106B, and 106C materials. Having the semiconductor heterostructure 104 with the laminate structure in this configuration, attains a superlattice of stress controlling layers with different properties.

The laminate layers of the 106A, 106B, and 106C of the laminate structure 108 materials can be formed from various materials. For example, the laminate layer 106A can include $SiO_2$, the laminate layer 106B can include AAO, while the laminate layer 106C can include AlN. It is understood that the laminate layers of the 106A, 106B, and 106C can include the use of other materials. In one embodiment, the laminate layers 106A, 106B, and 106C of different materials can be used to provide different functions within the semiconductor heterostructure 104 besides stress control. For example, in one embodiment, the laminate layer 106A can serve as a stress control layer, the laminate layer 106B can act as a light reflective UV layer, while the laminate layer 106C can be used as a metal-organic chemical vapor deposition (MOCVD) chamber protective layer that prevents the other sublayers from contaminating a MOCVD chamber used to epitaxially grow the semiconductor layers of the semiconductor heterostructure 104. In this embodiment, the laminate layers 106A, 106B and 106C can be deposited in an adjacent chamber prior to transferring an epi-structure to the MOCVD chamber.

As noted above, the laminate layers of the 106A, 106B, and 106C of the laminate structure 108 can have different properties. In one embodiment, the laminate layers of the 106A, 106B, and 106C of the laminate structure 108 can have different coefficients of thermal expansion. The different coefficients of thermal expansion for the laminate layers of the 106A, 106B, and 106C are represented in FIG. 7 by $\alpha_1(T)$, $\alpha_2(T)$, and $\alpha_3(T)$, respectively. The varying thermal expansion coefficient $\alpha(T)$ for these layers can be a complex function of temperature. Having laminate layers of different coefficients of thermal expansion results in the semiconductor heterostructure 104 having stresses changing as a function of temperature of the structure. Such stresses can increase or decrease, for example, when the structure cools after the epitaxial growth process.

In another embodiment, the laminate layers 106A, 106B, and 106C of the laminate structure 108 can have different indexes of refraction for a predetermined wavelength of radiation corresponding to an emitted/absorbed radiation. For example, the laminate layers 106A, 106B, and 106C can have alternating indexes of refraction, wherein each laminate layer has a thickness of about one-quarter the wavelength of radiation. Having laminate layers with different indexes of refraction results in the semiconductor heterostructure 104 having reflective properties to the target radiation in addition to the stress control properties.

In one embodiment, the stress control layer 106 can include a nanostructured layer. In this manner, each of the laminate structures 108 can take the form of nano-pillars. In an embodiment, the nano-pillars can deposited in the semiconductor heterostructure 104 at an angle other than normal to the growth surface of the corresponding semiconductor layers. In an embodiment, the angle can be in a range of angles between a few degrees to a few tens of degrees, e.g., between 3-40 degrees. To this extent, the nano-pillar density in the stress control layer 106 can determine the average index of refraction of the layer. In one embodiment, the index of refraction of the nano-pillars in the stress control layer 106 can vary laterally. In one embodiment, the index of refraction of the nano-pillars in the stress control layer 106 can vary in a direction normal to that of the direction of the stress control layer 106. In one embodiment, the index of refraction variation of the nano-pillars in the stress control layer 106 can be graded to form nano-pillars with a graded variation.

Figure 8A:
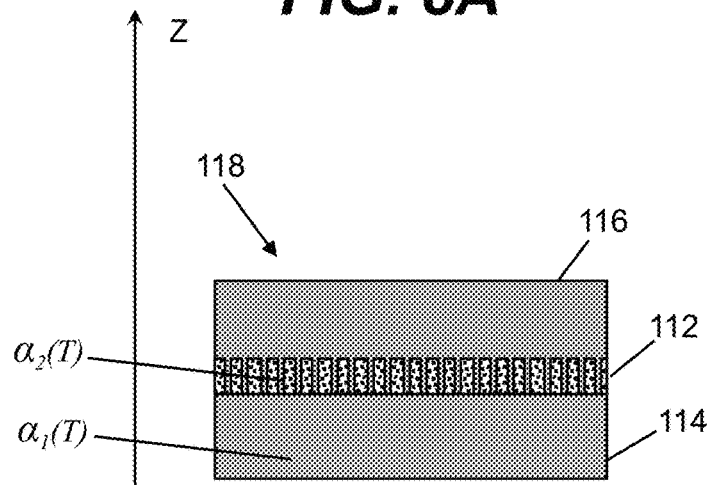
FIGS. 8A-8C show a method of growing a stress control layer according to an embodiment.
Figure 8B:
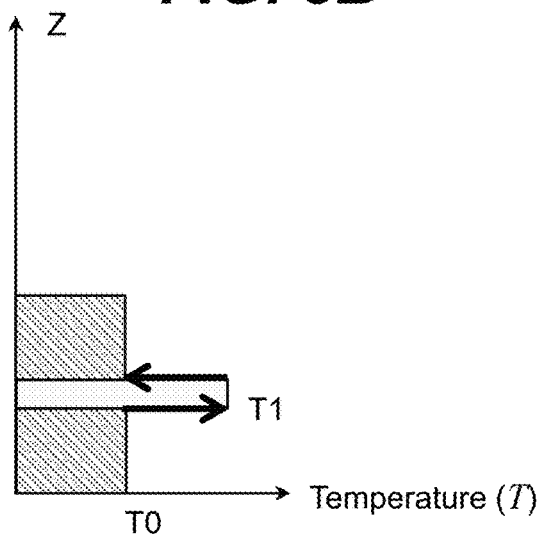
Figure 8C:
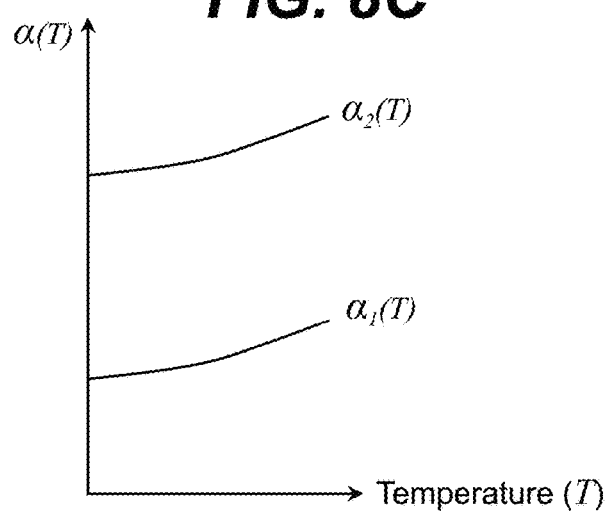

FIGS. 8A-8C show a method of growing a stress control layer in any of the semiconductor heterostructures described herein. In particular, FIGS. 8A-8C illustrate one example of forming a stress control layer 112 between surrounding semiconductor layers 114 and 116 in a semiconductor heterostructure 118. FIG. 8A shows the set of domains of the stress control layer 112 alternating with a set of domains of the surrounding semiconductor layer. As shown in FIG. 8C, the stress control layer 112 has a coefficient of thermal expansion $\alpha_2(T)$ that is different than the coefficient of thermal expansion $\alpha_1(T)$ for semiconductor layers 114 and 116. FIG. 8B illustrates the temperature in which the stress control layer 112 can be deposited in relation to the temperature of the adjacent semiconductor layers 114 and 116. In particular, FIG. 8B shows that stress control layer 112 can be deposited at temperature T1, which is larger than the temperature T0 for the neighboring semiconductor layers 114 and 116. As the stress control layer 112 cools from temperature T1 to temperature T0, it can provide compressive or tensile stresses to the neighboring semiconductor layers 114 and 116 depending on its coefficient of thermal expansion.

FIG. 8C shows in this example that the thermal expansion coefficient $\alpha_2(T)$ for the stress control layer 112 is greater than the thermal expansion coefficient $\alpha_1(T)$ for the semiconductor layers 114 and 116. In this case, the stress control layer 112 will impart a compressive strain that is experienced by the semiconductor layers 114 and 116. That is, since the semiconductor layer 116 grown above the stress control layer 112 is largely lattice matched with the semiconductor layer 114, both of these semiconductor layers will experience compressive stresses when stress control layer is cooled from temperature T1 to temperature T0. It is understood that the deposition of the stress control layer 112 does not have to be done in the MOCVD chamber and can be done in a separate chamber. Moreover, after the deposition of the stress control layer 112, the semiconductor layers 114 and 116 may be further cooled to the room temperature and patterned prior to subsequent MOCVD growth.

Figure 9A:
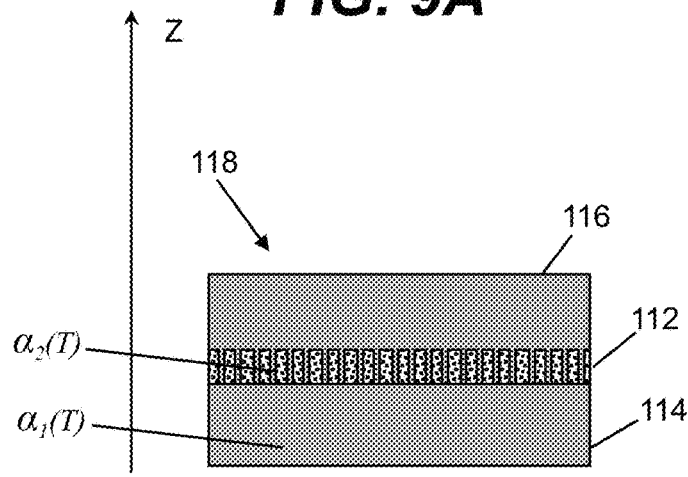
FIGS. 9A-9C show a method of growing a stress control layer according to another embodiment.
Figure 9B:
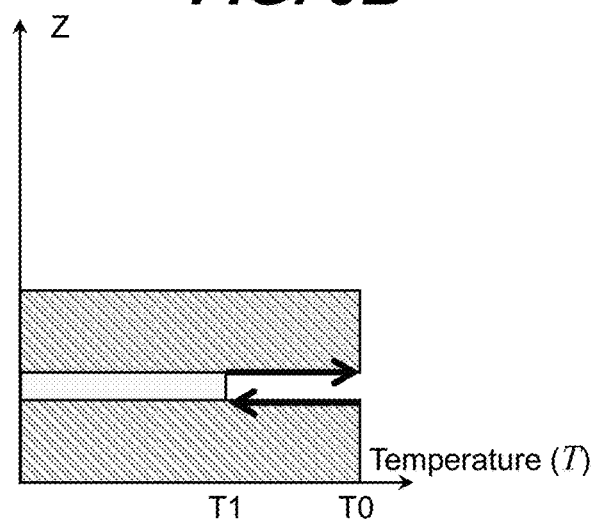
Figure 9C:
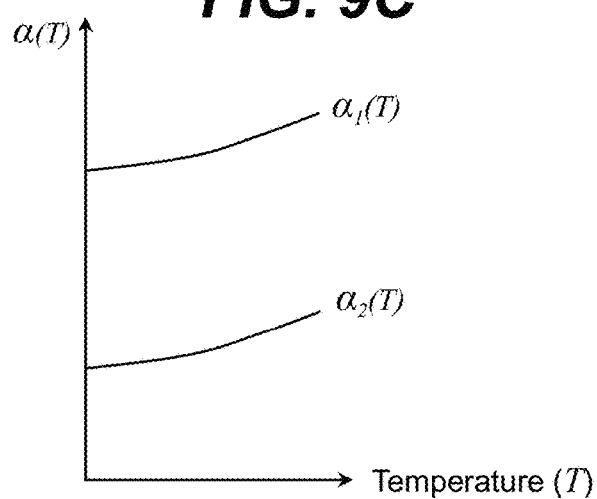

FIGS. 9A-9C show a method of growing a stress control layer according to another embodiment. In particular, FIGS. 9A-9C illustrate another example of forming the stress control layer 112 between the semiconductor layers 114 and 116 in the semiconductor heterostructure 118. In this example, as shown in FIG. 9C, the thermal expansion coefficient $\alpha_2(T)$ for the stress control layer 112 is less than the thermal expansion coefficient $\alpha_1(T)$ for the semiconductor layers 114 and 116. In such a scenario, when the thermal expansion coefficient $\alpha_2(T)$ for the stress control layer 112 is less than the thermal expansion coefficient $\alpha_1(T)$ for the semiconductor layers 114 and 116, the layers can have a different method deposition. In this case, as shown in FIG. 9B, the stress control layer 112 can be deposited at lower temperatures than neighboring semiconductor layers 114 and 116. In particular, FIG. 9B shows that stress control layer 112 can be deposited at temperature T1, which is lower than the temperature T0 for the neighboring semiconductor layers 114 and 116.

As the semiconductor layers 114 and 116 heat from temperature T1 to temperature T0, the stress control layer 112 will impart a compressive strain that is experienced by the semiconductor layers 114 and 116. It is understood that for this embodiment, the stress control layer can be deposited at lower temperatures than neighboring semiconductor layers 114 and 116. In one embodiment, a high temperature MOCVD growth process can be used to attain the semiconductor heterostructure 118 depicted in FIGS. 9A-9C.

In order to attain semiconductor heterostructures depicted in FIGS. 8A-8C or FIGS. 9A-9C, the difference between the coefficients of thermal expansion for the stress control layer 112 and the semiconductor layers 114 and 116 can extend over a wide range. For example, in one embodiment, the stress control layer 112 can have a coefficient of thermal expansion that is at least 10% different from a coefficient of thermal expansion for the adjacent semiconductor layers 114 and 116. Having a stress control layer with a coefficient of thermal expansion that is at least 10% different from a thermal coefficient of its adjacent semiconductor layers is beneficial in that it can provide adequate stress control over a range of temperatures available during epitaxial growth.

Figure 10A:
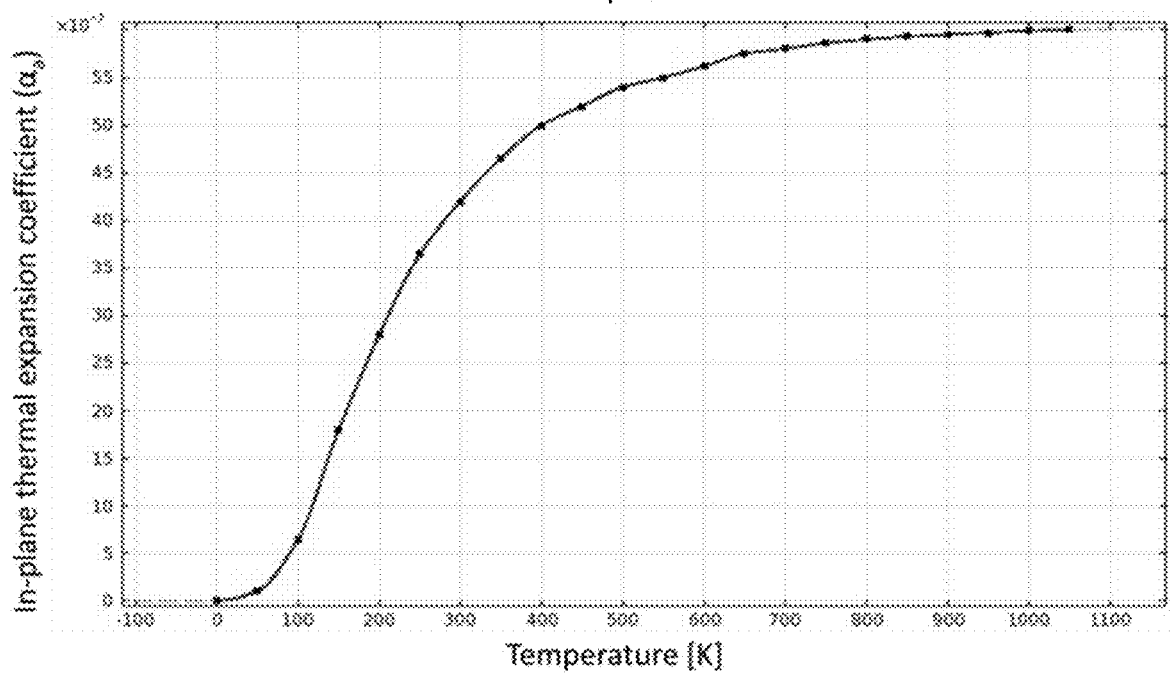
FIGS. 10A and 10B show thermal expansion coefficients of GaN and AlN, respectively.
Figure 10B:
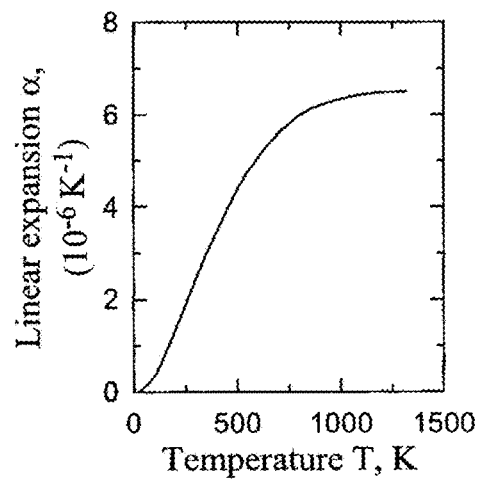

Possible materials that can serve for stress control regions include MgO, which is a material with a thermal expansion that can be twice as large as the thermal expansion of semiconductor layers composed of group III nitride. In another example, AlZnO can be used as a possible material for a stress control layer. A stress control layer formed of AlZnO can be desirable as AlZnO can be tailored by altering the molar ratio of Al and Zn to yield an appropriate stress control layer. Magnesium aluminosilicate also can be used to form a stress control region. FIGS. 10A and 10B show the thermal expansion coefficients of GaN and AlN, respectively. As can be seen, they are functions of temperature.

Figure 11:
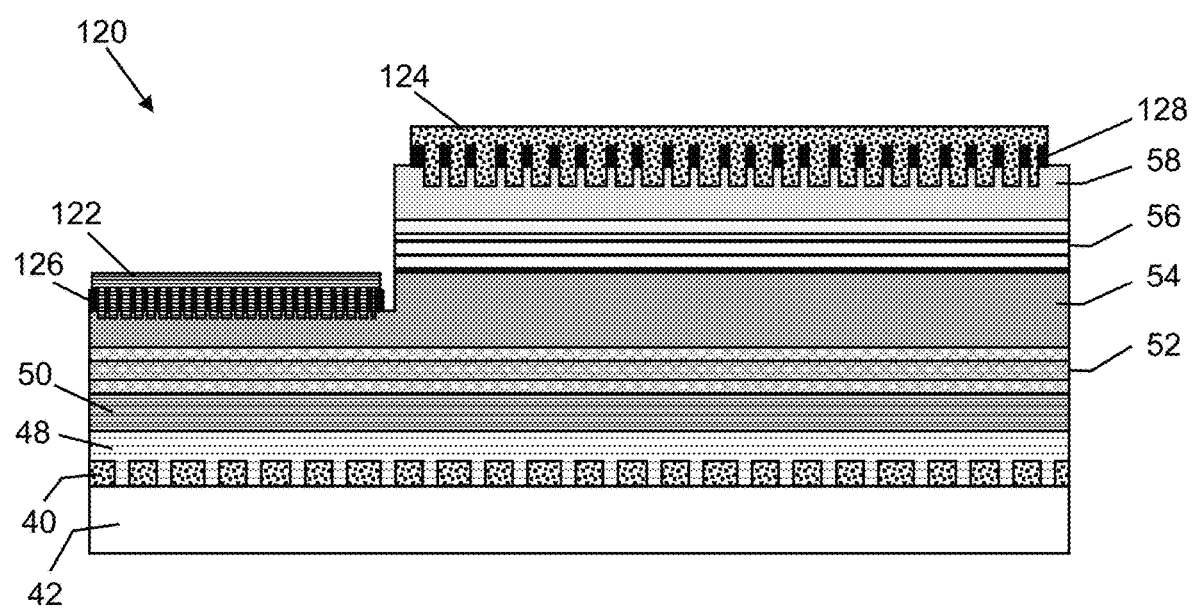
FIG. 11 shows a schematic of a semiconductor heterostructure with a stress control layer formed on a buffer layer and a stress control layer formed on both an n-type contact semiconductor layer and a p-type contact semiconductor layer according to an embodiment.

FIG. 11 shows a schematic of a semiconductor heterostructure 120 with multiple stress control layers according to another embodiment. As depicted, a stress control layer 40 can be formed between the substrate 42 and the buffer layer 48. A second stress control layer 122 can be formed on the n-type contact semiconductor layer 54, while a third stress control layer 124 can be formed on the p-type contact semiconductor layer 58. In one embodiment, the stress control layers 122 and 124 are patterned between an n-type metallic contact 126 formed on the n-type contact semiconductor layer 54 and a p-type metallic contact 128 formed on the p-type contact semiconductor layer 58. As shown in FIG. 11, both the stress control layers 122 and 124 have a main flat portion extending over the n-type metallic contact 126 and the p-type metallic contact 128, respectively. In addition, the stress control layers 122 and 124 have a set of protrusions that extend through patterned flat sections of the n-type metallic contact 126 and the p-type metallic contact 128, respectively. As shown in FIG. 11, the protrusions of the stress control layers 122 and 124 can extend through the n-type metallic contact 126 and the p-type metallic contact 128, respectively, and into the n-type contact semiconductor 54 and the p-type contact semiconductor 58, respectively.

Due to the location of the various stress control layers 40, 122 and 124 in the semiconductor heterostructure 120, these stress control layers can be deposited at different times of epitaxial growth of the heterostructure. In particular, the stress control layers 40, 122 and 124 can be deposited at the beginning and end of the epitaxial growth of the semiconductor structure to control the stresses within the buffer layer 48 and the stresses within the n-type metallic contact 126 and the p-type metallic contact 128. For example, the n-type contact semiconductor layer 54 and the p-type contact semiconductor layer 58 can be patterned prior to deposition of the metallic contacts 126 and 128 respectively. The metallic contacts 126 and 128 can then be subsequently deposited over the patterned n-type and p-type contact semiconductor layers 54 and 58, respectively, at first regions which may or may not coincide with the peaks or valleys of the patterned surfaces. Subsequently, the stress control layers 122 and 124 can be deposited to alter the stress of the n-type contact semiconductor layer 54 and the p-type contact semiconductor layer 58, respectively, in proximity of the metallic contacts 126 and 128, respectively.

In one embodiment, the stress control layers 122 and 124 can be deposited adjacent or in close proximity to the n-type contact semiconductor layer 54 and the p-type contact semiconductor layer 58, respectively. For example, the stress control layer 124 can be deposited in the p-type contact semiconductor layer 58 or adjacent (or in close proximity) to a boundary of the semiconductor layer. As used herein, close proximity means being located to within 10% of the thickness of the p-type contact semiconductor layer 58 from its boundary. In one embodiment, the patterned stress control layer 124 can be characterized by a set of openings with a characteristic distance that is comparable to the current diffusion length within the p-type contact semiconductor layer 58. Similarly, the stress control layer 122 can be deposited in the n-type contact semiconductor layer 54 or adjacent (or in close proximity) to a boundary of the semiconductor layer. In one embodiment, the patterned stress control layer 122 can be characterized by a set of openings with a characteristic distance that is comparable to the current diffusion length within the n-type contact semiconductor layer 56.

Figure 12A:
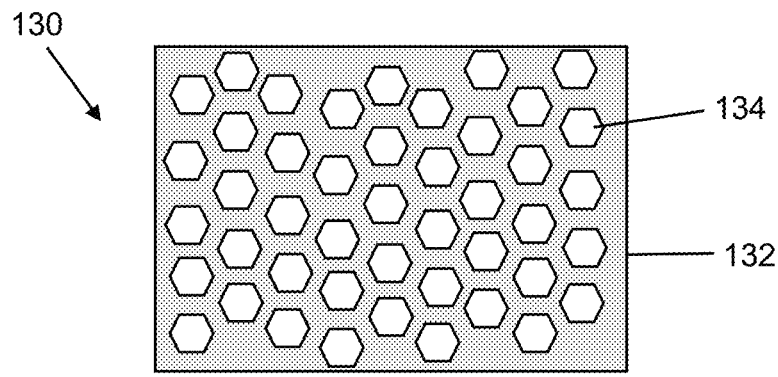
FIGS. 12A-12B show schematics of a stress control layer in a semiconductor heterostructure having variable patterning of stress control regions according to embodiments.
Figure 12B:
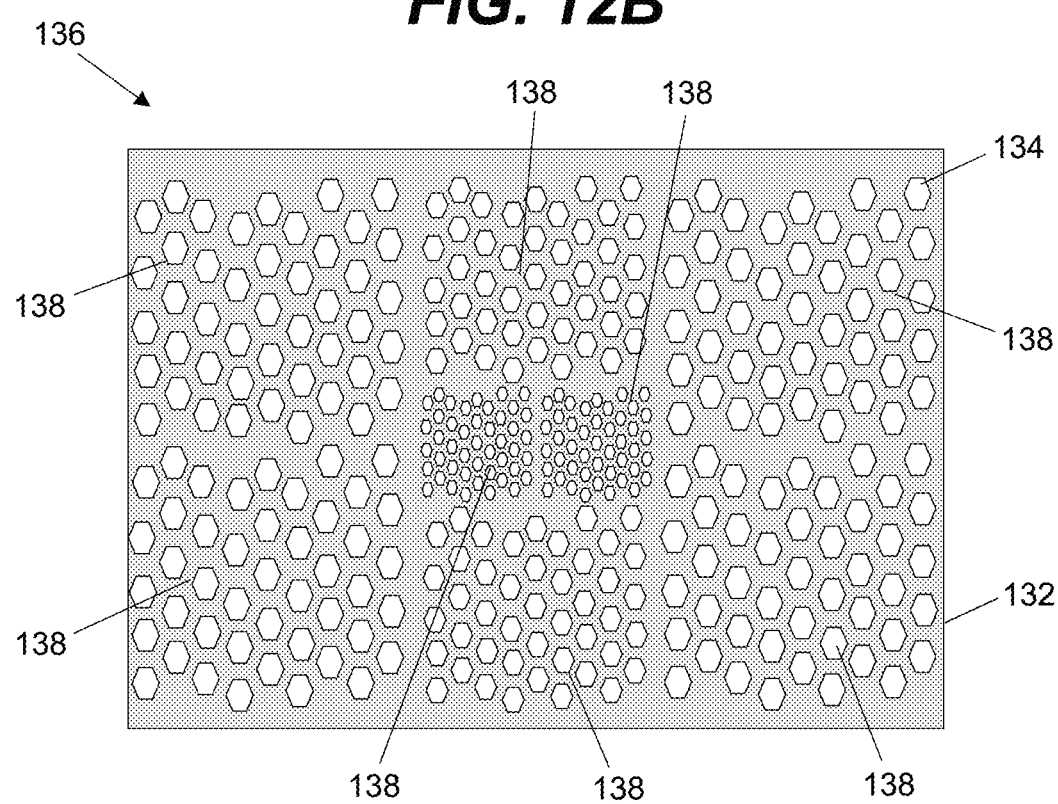

FIGS. 12A-12B show schematics of a stress control layer in a semiconductor heterostructure having variable patterning of stress control regions according to embodiments. For clarity, the semiconductor heterostructures of FIGS. 12A-12B only show stress control layers having variable patterning of stress control regions. It is understood that the semiconductor heterostructures could have additional semiconductor layers. Nevertheless, the stress control layers of FIGS. 12A-12B have a set of stress control regions that can be disposed in a lateral direction and a vertical direction to form grouped or disjoined domains.

FIG. 12A shows a semiconductor heterostructure 130 having a stress control layer 132 with a set of stress control regions 134 that form a patterned periodic structure. As used herein, a patterned periodic structure is a structure that has a lateral special periodicity, e.g., the structure comprises domains forming a two dimensional lattice. In one embodiment, the stress control regions 134 form an oscillating pattern in both the lateral and vertical directions of the stress control layer 132. This oscillating pattern of stress control regions 134 in both the lateral and vertical directions can form a photonic crystal. It is understood that the configuration depicted in FIG. 12A illustrates only one example of a patterned periodic structure that can be formed in a stress control layer and is not meant to limit the various embodiments described herein.

The semiconductor heterostructure 136 of FIG. 12B shows the stress control layer 132 with the set of stress control regions 134 in a more complex variation in its arrangement. In particular, the stress control regions 134 form a plurality of grouped (e.g., joined) domains 138 in both the lateral and vertical directions of the stress control layer 132, where a grouped domain is described by a characteristic local separation between the stress control layer and the characteristic size of the stress control layer as shown in the FIG. 12B. As shown in FIG. 12B, each grouped domain 138 is disunited from other grouped domains in the stress control layer 132 in that each is not associated with the grouping of the other domains. The set of stress control regions 134 in each grouped domain 138 can differ in thickness, shape, number, area, and/or size from the set of stress control regions in the other disunited domains. For example, as shown in FIG. 12B, the stress control regions 134 in the two center domains 138 can have different sizes and thickness in comparison to the other stress control regions in the other disunited domains. In other embodiments, the set of stress control regions 134 in each grouped domain 138 can differ by varying composition, and the use of roughness elements and voids.

In one embodiment, the grouped domains 138 can have a characteristic size of a wavelength and a characteristic distance between each other that is on the order of a wavelength. Having grouped domains 138 with a characteristic size and spacing there between that is on the order of a wavelength results in an ability to fabricate local domains that act as a photonic crystal to control the optical properties of the layers. In one embodiment, the set of grouped domains 138 of a stress control region 134 can form a network of connected domains (e.g., a percolation network) in the stress control layer 132.

Figure 13:
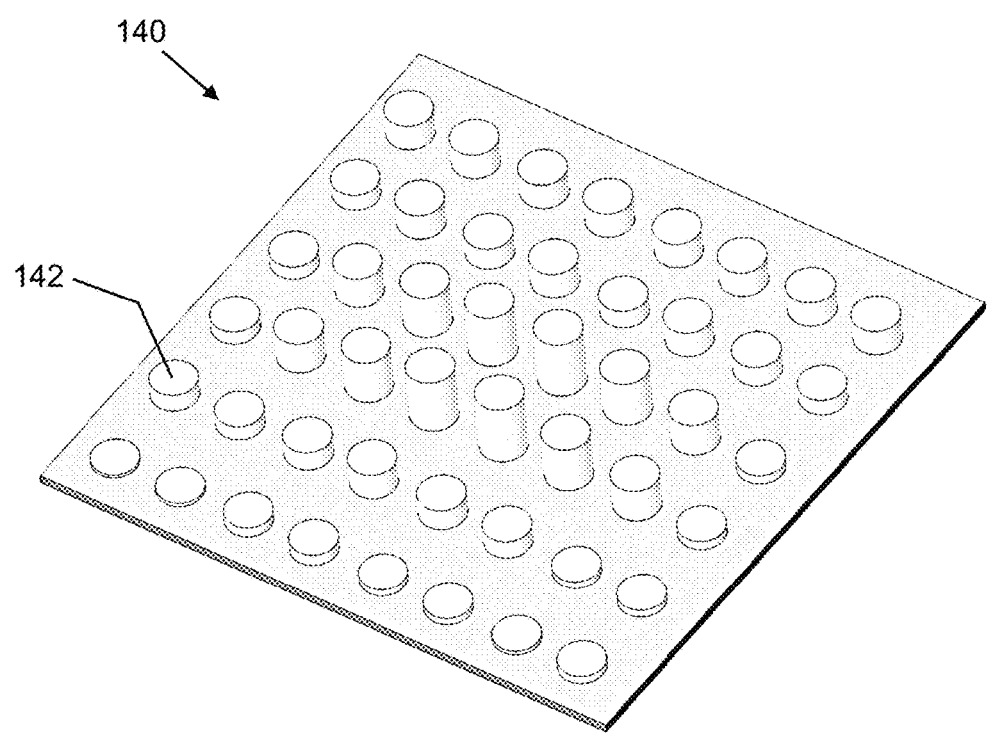
FIG. 13 shows a schematic of a stress control layer in a semiconductor heterostructure having vertical variation of stress control regions according to an embodiment.

FIG. 13 shows a schematic of a stress control layer 140 for use in a semiconductor heterostructure with a set of stress control regions 142 having vertical variation according to an embodiment. Such vertical variations can allow for additional stress and/or light extraction control. In particular, such variations can create a laterally varying average index of refraction and result in layer having properties of a lens, such as capable of focusing radiation. In one embodiment, the stress control regions 142 located near the center of the stress control layer 140 can have a greater height than the stress control regions located on the periphery of the layer. In an embodiment, the difference can be as much as 100%.

As shown in FIG. 13, the height of the stress control regions 142 can gradually increase from locations on the periphery of the stress control layer 140 to the center where the stress control regions can have the greatest height. It is understood that the embodiment depicted in FIG. 13 is just one possible configuration showing how the stress control regions 142 of a stress control layer 140 can vary vertically. Those skilled in the art will appreciate that the stress control regions 142 of the stress control layer 140 can have a multitude of different vertical variations. In addition to having vertical variation, the stress control regions 142 can vary in a number of ways in the stress control layer 140. For example, the stress control regions 142 can vary in shape, size, thickness, composition, and/or surface texture (e.g., roughness surfaces). The stress control regions 142 can also differ by indexes of refraction and coefficients of thermal expansion.

Figure 14:
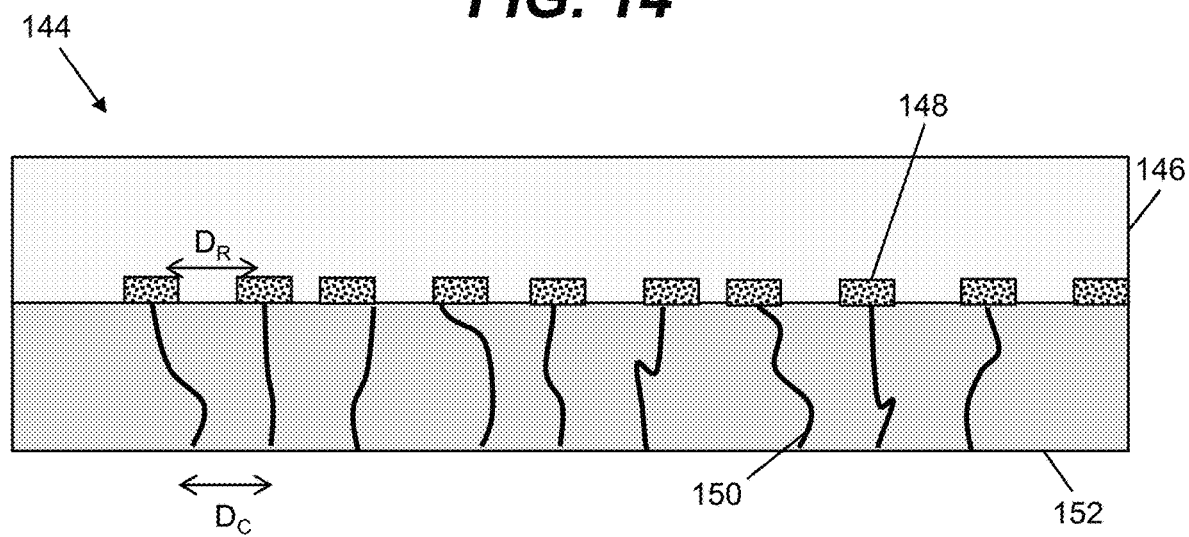
FIG. 14 shows a schematic of a semiconductor heterostructure having a stress control layer with stress control regions spaced a predetermined distance corresponding with dislocation cores formed in an underlying layer according to an embodiment.

FIG. 14 shows a schematic of a semiconductor heterostructure 144 having a stress control layer 146 with stress control regions 148 spaced a predetermined distance corresponding with dislocation cores 150 formed in an underlying semiconductor layer 152 according to an embodiment. As shown in FIG. 14, the distance, $D_C$, between dislocation cores 150 in the semiconductor layer 152 coincides with the distance, $D_R$, between the stress control regions 148 in the stress control layer 146 (as measured center-to-center). Having the distance, $D_C$, between dislocation cores 150 correspond with the distance, $D_R$, between the stress control regions 148 helps in preventing the dislocation cores from permeating from the semiconductor layer 152 into other layers (not depicted in FIG. 14) in the semiconductor heterostructure 144 that are grown on the stress control layer 146. In one embodiment, the distance, $D_C$, between dislocation cores 150 and the distance, $D_R$, between the stress control regions 148 can be about 1 micron. In general, the distances depend on the dislocation density and can be typically between a few tens of nanometers to a few microns, and typically larger than 100 nm.

Figure 15:
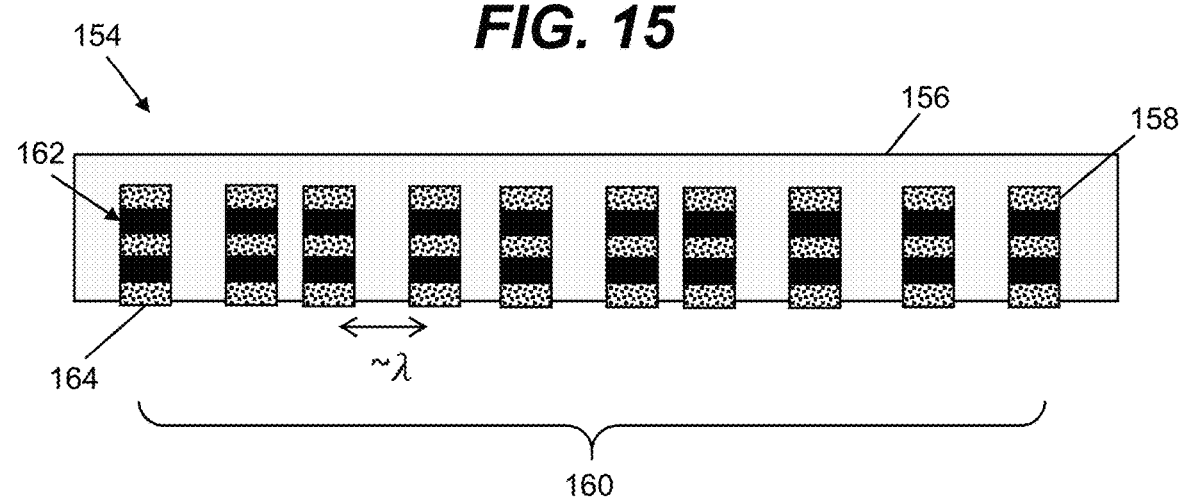
FIG. 15 shows a schematic of a semiconductor heterostructure having a stress control layer with stress control regions that form a Distributed Bragg Reflector according to an embodiment.

FIG. 15 shows a schematic of a semiconductor heterostructure 154 having a stress control layer 156 with stress control regions 158 that form a DBR according to an embodiment. In the embodiment of FIG. 15, the stress control regions 158 are arranged as a periodic photonic crystal 160, where each stress control region is composed of stacks 162 of stress control sublayers 164. The stress control sublayers 164 in each of the stacks 162 can include different materials, coefficients of thermal expansion and indexes of refraction. In one embodiment, the stress control sublayers 164 in each of the stacks 162 can include alternating sublayers of different materials and indexes of refraction. For example, the sublayers 164 can includes pairs of AAO and $HfO_2$ layers. The photonic crystal 160 or structure formed from the stacks 162 of stress control regions 158 can affect the extraction of light from the semiconductor heterostructure 154 due to interference effects.

In one embodiment, the characteristic distance between the stacks 162 of the stress control regions 158 can be on the order of a wavelength ($\lambda$) of the target radiation. By having alternating sublayers 164 in each of the stacks 162, with thicknesses that coincide with an optical length scale (e.g., about ¼ of the wavelength of the light), the stress control regions 158 in the stress control layer 156 can result in the DBR. Having a DBR in the stress control layer 156 of the semiconductor heterostructure 154 is beneficial because such a layer can be used to reflect the radiation within the device resulting in improved optical properties of the optoelectronic device such as improved extraction efficiency. It is understood that the semiconductor heterostructure 154 could have additional semiconductor layers that are used in conjunction with the stress control layer 156 depicted in FIG. 15.

Figure 16:
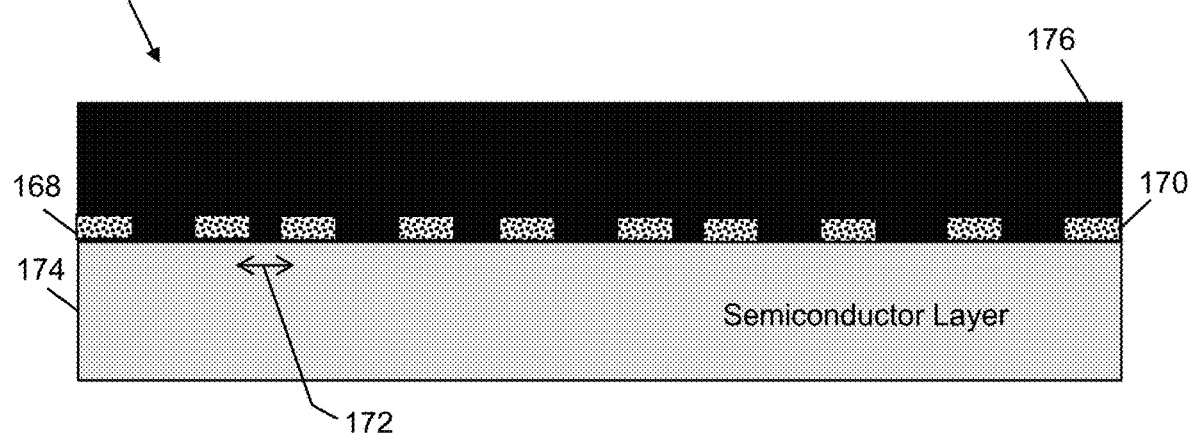
FIG. 16 shows a schematic of a semiconductor heterostructure having a stress control layer with stress control regions spaced a predetermined distance corresponding with a current spreading length of an underlying semiconductor layer according to an embodiment.

FIG. 16 shows a schematic of a semiconductor heterostructure 166 having a stress control layer 168 with stress control regions 170 spaced apart a predetermined distance corresponding with a current spreading length 172 of an underlying semiconductor layer 174 according to an embodiment. In one embodiment, the stress control layer 168 can be patterned on the semiconductor layer 174 such that the stress control layer forms elevated regions (i.e., the stress control regions 170) and flat depressions formed between each of the elevated regions. As shown in FIG. 16, an n-type or p-type contact semiconductor layer 176 can be formed on the stress control layer 168, covering all of the elevated regions and the flat depressions.

Having the length scale of the stress control regions 170 of the stress control layer 168 coincide with an electrical length scale of the semiconductor layer 174 such as the current spreading length is beneficial for various reasons. For example, such an arrangement can allow for relatively unimpeded current flow throughout the semiconductor layer 174. It is understood that the length scale of the stress control regions 170 of the stress control layer 168 can coincide with other electrical length scales of the semiconductor layer 174 besides the current spreading length. For example, the stress control regions 170 can coincide with hole diffusion length of the semiconductor layer 174.

Figure 17:
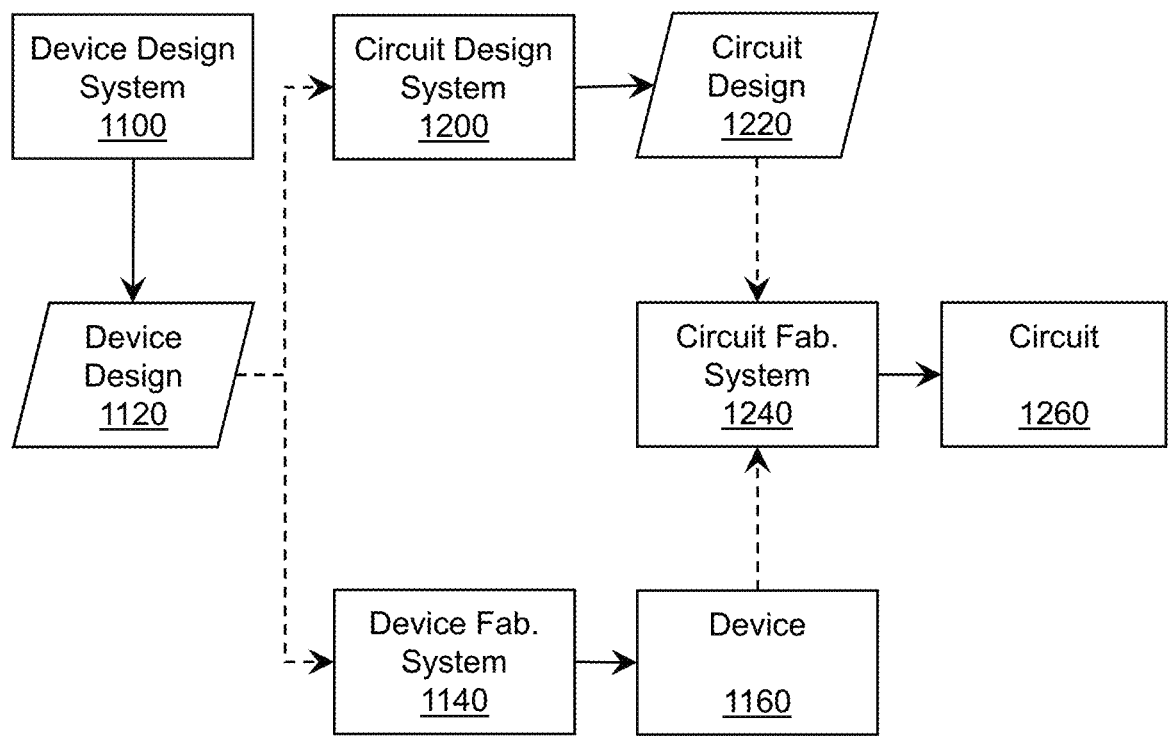
FIG. 17 shows an illustrative flow diagram for fabricating a semiconductor heterostructure having at least one stress control layer according to one of the various embodiments described herein.

In one embodiment, the invention provides a method of designing and/or fabricating a circuit that includes one or more of the devices designed and fabricated as described herein. To this extent, FIG. 17 shows an illustrative flow diagram for fabricating a circuit 1260 according to an embodiment. Initially, a user can utilize a device design system 1100 to generate a device design 1120 for a semiconductor device as described herein. The device design 1120 can comprise program code, which can be used by a device fabrication system 1140 to generate a set of physical devices 1160 according to the features defined by the device design 1120. Similarly, the device design 1120 can be provided to a circuit design system 1200 (e.g., as an available component for use in circuits), which a user can utilize to generate a circuit design 1220 (e.g., by connecting one or more inputs and outputs to various devices included in a circuit). The circuit design 1220 can comprise program code that includes a device designed as described herein. In any event, the circuit design 1220 and/or one or more physical devices 1160 can be provided to a circuit fabrication system 1240, which can generate a physical circuit 1260 according to the circuit design 1220. The physical circuit 1260 can include one or more devices 1160 designed as described herein.

In another embodiment, the invention provides a device design system 1100 for designing and/or a device fabrication system 1140 for fabricating a semiconductor device 1160 as described herein. In this case, the system 1100, 1140 can comprise a general purpose computing device, which is programmed to implement a method of designing and/or fabricating the semiconductor device 1160 as described herein. Similarly, an embodiment of the invention provides a circuit design system 1200 for designing and/or a circuit fabrication system 1240 for fabricating a circuit 1260 that includes at least one device 1160 designed and/or fabricated as described herein. In this case, the system 1200, 1240 can comprise a general purpose computing device, which is programmed to implement a method of designing and/or fabricating the circuit 1260 including at least one semiconductor device 1160 as described herein. In either case, the corresponding fabrication system 1140, 1240, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1100 to generate the device design 1120 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1100 for designing and/or a device fabrication system 1140 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure, comprising:
   a substrate;
   a plurality of semiconductor layers located on the substrate; and
   at least one stress control layer located within the plurality of semiconductor layers, each of the at least one stress control layer inducing one of: a tensile stress or a compressive stress, in an adjacent semiconductor layer in the plurality of semiconductor layers, the induced stress changing a stress in the adjacent semiconductor layer by at least 10% as compared to a semiconductor heterostructure having no stress control layer, the change in stress of the adjacent semiconductor layer extending from a boundary with the stress control layer into an interior portion of the adjacent semiconductor layer that is at least twice a thickness of the stress control layer, wherein each at least one stress control layer includes a plurality of stress control regions, each stress control region separated from adjacent stress control regions by a predetermined spacing, each stress control region having a characteristic size that is approximately equivalent to one of: a square root of an inverse dislocation density in the adjacent semiconductor layer or a distance resulting in a critical strain within the adjacent semiconductor layer;

wherein some of the plurality of stress control regions in the at least one stress control layer extend into adjacent semiconductor layers of the plurality of semiconductor layers, wherein some of the plurality of stress control regions that extend into adjacent semiconductor layers form a void region in those adjacent semiconductor layers, and wherein some of the plurality of stress control regions that extend into adjacent semiconductor layers include a surface roughness extending from a portion of the stress control region in the stress control layer to a portion of the stress control region extending into the adjacent semiconductor layers.

2. The semiconductor heterostructure of claim 1, wherein the at least one stress control layer includes at least two stress control layers, wherein each of the at least two stress control layers is formed in a different semiconductor layer.

3. The semiconductor heterostructure of claim 1, wherein the plurality of stress control regions in the at least one stress control layer vary in one of height, material or size.

4. The semiconductor heterostructure of claim 1, wherein the at least one stress control layer comprises stacks of stress control regions.

5. The semiconductor heterostructure of claim 1, wherein the stress control layer includes a laminate structure of a plurality of laminate layers, each laminate layer comprising a plurality of segmented stress control regions, the segmented stress control regions in each laminate layer formed of a different material than a material of the other of the plurality of laminate layers.

6. The semiconductor heterostructure of claim 1, wherein the plurality of stress control regions are disposed in the stress control layer in a lateral direction and a vertical direction.

7. The semiconductor heterostructure of claim 6, wherein sets of stress control regions in each of the lateral direction and the vertical direction form a plurality of grouped domains, each grouped domain disunited from other grouped domains in the stress control layer.

8. The semiconductor heterostructure of claim 7, wherein the set of stress control regions in each grouped domain differ in at least one of: thickness, shape, number, area, or size, from the set of stress control regions in other disunited domains.

9. An optoelectronic device, comprising:
a substrate;
a semiconductor heterostructure located on the substrate, the semiconductor heterostructure including plurality of semiconductor layers located on the substrate, the plurality of semiconductor layers including a stress control layer and an adjacent semiconductor layer, the stress control layer including a patterned layer having a plurality of elevated regions with flat depressions formed between each of the elevated regions, wherein the adjacent semiconductor layer is located over the elevated regions and in between the flat depressions, the stress control layer inducing one of: a tensile stress or a compressive stress, in the adjacent semiconductor layer, the induced stress changing a stress in the adjacent semiconductor layer by at least 10% as compared to a semiconductor heterostructure having no stress control layer, the change in stress of the adjacent semiconductor layer extending from a boundary with the stress control layer into an interior portion of the adjacent semiconductor layer that is at least twice a thickness of the stress control layer, and wherein each elevated region has a characteristic size that is approximately equivalent to one of: a square root of an inverse dislocation density in the adjacent semiconductor layer or a distance resulting in a critical strain within the adjacent semiconductor layer;

an n-type metallic contact formed on the semiconductor heterostructure;

a p-type metallic contact formed on the semiconductor heterostructure;

an n-type stress control layer formed on the n-type metallic contact, the n-type stress control layer having a plurality of n-type stress control protrusions that penetrate through the n-type metallic contact into the semiconductor heterostructure; and a p-type stress control layer formed on the p-type metallic contact, the p-type stress control layer having a plurality of p-type stress control protrusions that penetrate through the p-type metallic contact into the semiconductor heterostructure.

10. The optoelectronic device of claim 9, wherein the stress control layer includes one of: a patterned polycrystalline material or a patterned amorphous group III nitride semiconductor material.

11. The optoelectronic device of claim 9, wherein the semiconductor heterostructure includes at least two stress control layers, wherein each of the at least two stress control layers is formed in a different semiconductor layer.

12. The optoelectronic device of claim 9, wherein the elevated regions of the stress control layer are nano-pillars.

13. The optoelectronic device of claim 12, wherein some of the nano-pillars extend beyond the adjacent semiconductor layer into another semiconductor layer of the plurality of semiconductor layers.

14. The optoelectronic device of claim 13, wherein some of the nano-pillars extend upward above the stress control layer and some of the nano-pillars extend downward under the stress control layer.

15. The optoelectronic device of claim 13, wherein some of the nano-pillars have an outer surface with a surface roughness.

16. The semiconductor heterostructure of claim 1, wherein each stress control layer comprises one of a dielectric layer and a semiconductor layer transparent to ultraviolet radiation.

17. The semiconductor heterostructure of claim 2, wherein the stress control layers include different compositional material.

18. The semiconductor heterostructure of claim 1, wherein the stress control layer comprises a coefficient of thermal expansion that is at least 10% different from a thermal coefficient of an adjacent semiconductor layer.

19. The semiconductor heterostructure of claim 1, wherein each of the stress control regions has a characteristic width corresponding to a current spreading length of the adjacent semiconductor layer.

20. A method, comprising:
   forming an optoelectronic device, the forming including:
      obtaining a substrate;
      forming a semiconductor heterostructure on the substrate, the semiconductor heterostructure including plurality of semiconductor layers located on the substrate, the plurality of semiconductor layers including a stress control layer and an adjacent semiconductor layer, the stress control layer including a patterned layer having a plurality of elevated regions with flat depressions formed between each of the elevated regions, wherein the adjacent semiconductor layer is located over the elevated regions and in between the flat depressions, the stress control layer inducing one of: a tensile stress or a compressive stress, in the adjacent semiconductor layer, the induced stress changing a stress in the adjacent semiconductor layer by at least 10% as compared to a semiconductor heterostructure having no stress control layer, the change in stress of the adjacent semiconductor layer extending from a boundary with the stress control layer into an interior portion of the adjacent semiconductor layer that is at least twice a thickness of the stress control layer, and wherein each elevated region has a characteristic size that is approximately equivalent to one of: a square root of an inverse dislocation density in the adjacent semiconductor layer or a distance resulting in a critical strain within the adjacent semiconductor layer;
   forming an n-type metallic contact on the semiconductor heterostructure;
   forming a p-type metallic contact on the semiconductor heterostructure;
   forming an n-type stress control layer on the n-type metallic contact, the n-type stress control layer having a plurality of n-type stress control protrusions that penetrate through the n-type metallic contact into the semiconductor heterostructure; and
   forming a p-type stress control layer on the p-type metallic contact, the p-type stress control layer having a plurality of p-type stress control protrusions that penetrate through the p-type metallic contact into the semiconductor heterostructure.

* * * * *